United States Patent
Tanaka et al.

(10) Patent No.: US 10,534,172 B2
(45) Date of Patent: *Jan. 14, 2020

(54) DISPLAY APPARATUS

(71) Applicant: Sony Corporation, Tokyo (JP)

(72) Inventors: Eiichi Tanaka, Chiba (JP); Hirokazu Tatsuta, Kanagawa (JP); Shin Hasegawa, Kanagawa (JP); Yuichi Hasegawa, Tokyo (JP); Kenta Kawamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/903,639

(22) PCT Filed: May 16, 2014

(86) PCT No.: PCT/JP2014/063032
§ 371 (c)(1),
(2) Date: Jan. 8, 2016

(87) PCT Pub. No.: WO2015/008530
PCT Pub. Date: Jan. 22, 2015

(65) Prior Publication Data
US 2016/0147069 A1    May 26, 2016

(30) Foreign Application Priority Data

Jul. 16, 2013    (JP) .................................. 2013-147749

(51) Int. Cl.
*G02B 27/14*    (2006.01)
*G02B 27/01*    (2006.01)

(52) U.S. Cl.
CPC ..... *G02B 27/0172* (2013.01); *G02B 27/0176* (2013.01); *G02B 2027/0159* (2013.01);
(Continued)

(58) Field of Classification Search
CPC .... G02B 27/0172; G02B 17/08; G02B 25/00; G02B 27/0176; G02B 27/02;
(Continued)

(56) References Cited

U.S. PATENT DOCUMENTS 5,473,365 A    12/1995 Okamura
5,479,224 A    12/1995 Yasugaki et al.
(Continued)

FOREIGN PATENT DOCUMENTS

CN    1391126 A    1/2003
CN    1813213 A    8/2006
(Continued)

OTHER PUBLICATIONS

Chinese Office Action dated Mar. 22, 2018 in connection with Chinese Application No. 201480002757.2, and English translation thereof.
(Continued)

*Primary Examiner* — Dawayne Pinkney
(74) *Attorney, Agent, or Firm* — Wolf, Greenfield & Sacks, P.C.

(57) ABSTRACT

A display apparatus includes a frame and an image display apparatus for a left eye 3 and an image display apparatus for a right eye which are attached to the frame. Each image display apparatus 30 includes an image forming apparatus 40 and an optical system 50 configured to guide an image from the image forming apparatus 40 to a pupil of an observer 10. The optical system 50 includes a reflecting mirror 51 and a lens group 52. The image forming apparatus 40 is curved. A normal NLL of the reflecting mirror 51 included in the optical system of the image display apparatus for a left eye and a normal NLR of the reflecting mirror 51 included in the optical system of the image display apparatus for a right eye intersect with each other in a space on an (Continued)

opposite side of the observer 10 with respect to the reflecting mirror 51.

20 Claims, 17 Drawing Sheets

(52) U.S. Cl.
CPC ............. *G02B 2027/0161* (2013.01); *G02B 2027/0169* (2013.01)

(58) Field of Classification Search
CPC .... G02B 2027/0123; G02B 2027/0159; G02B 2027/0161; G02B 2027/0169; G02B 17/026; G02B 2027/0129; G02B 2027/0132; G02F 1/133305; H01L 51/0097; H01L 2251/5338
USPC .................................................. 359/629–633
See application file for complete search history.

(56) References Cited

U.S. PATENT DOCUMENTS

| | | | |
|---|---|---|---|
| 5,486,841 A | 1/1996 | Hara et al. | |
| 5,739,797 A | 4/1998 | Karasawa et al. | |
| 5,748,375 A | 5/1998 | Yamana | |
| 5,774,096 A | 6/1998 | Usuki et al. | |
| 5,793,339 A | 8/1998 | Takahashi | |
| 5,828,432 A | 10/1998 | Shashidhar et al. | |
| 5,835,279 A * | 11/1998 | Marshall ............... G02B 13/18 359/645 | |
| 6,100,862 A | 8/2000 | Sullivan | |
| 6,124,837 A | 9/2000 | Usuki et al. | |
| 6,172,657 B1 | 1/2001 | Kamakura et al. | |
| 6,239,771 B1 | 5/2001 | Usuki et al. | |
| 6,529,331 B2 | 3/2003 | Massof et al. | |
| 7,446,941 B2 | 11/2008 | Fukuda | |
| 8,411,134 B2 | 4/2013 | Tomita | |
| 8,570,242 B2 | 10/2013 | Chosokabe et al. | |
| 8,739,797 B2 | 6/2014 | Bonutti | |
| 8,797,433 B2 | 8/2014 | Kaizu et al. | |
| 8,861,090 B2 | 10/2014 | Mukawa | |
| 8,907,865 B2 | 12/2014 | Miyawaki et al. | |
| 8,976,453 B2 | 3/2015 | Akutsu et al. | |
| 8,988,315 B2 | 3/2015 | Mukawa et al. | |
| 9,016,864 B2 | 4/2015 | Sasazaki et al. | |
| 9,164,221 B2 | 10/2015 | Akutsu et al. | |
| 9,201,242 B2 | 12/2015 | Miyawaki et al. | |
| 9,311,752 B2 | 4/2016 | Chosokabe et al. | |
| 9,451,244 B2 | 9/2016 | Sasazaki et al. | |
| 9,488,846 B2 | 11/2016 | Hayashi | |
| 9,558,540 B2 | 1/2017 | Mukawa | |
| 9,569,897 B2 | 2/2017 | Miyawaki et al. | |
| 9,658,456 B2 | 5/2017 | Mukawa | |
| 9,709,809 B2 | 7/2017 | Miyawaki et al. | |
| 9,726,890 B2 | 8/2017 | Akutsu et al. | |
| 9,753,284 B2 | 9/2017 | Machida et al. | |
| 9,759,920 B2 | 9/2017 | Akutsu et al. | |
| 9,766,453 B2 | 9/2017 | Mukawa | |
| 9,791,701 B2 | 10/2017 | Ato et al. | |
| 9,899,000 B2 | 2/2018 | Takahota et al. | |
| 9,933,621 B2 | 4/2018 | Hirano et al. | |
| 9,952,435 B2 | 4/2018 | Tanaka et al. | |
| 9,972,135 B2 | 5/2018 | Mukawa | |
| 10,018,846 B2 | 7/2018 | Machida et al. | |
| 10,302,946 B2 | 5/2019 | Aiki | |
| 10,338,388 B2 | 7/2019 | Hirano et al. | |
| 2002/0047952 A1* | 4/2002 | Kawata ............... G04G 17/045 349/58 | |
| 2002/0181115 A1 | 12/2002 | Massof et al. | |
| 2002/0196554 A1* | 12/2002 | Cobb ............... G02B 27/0172 359/633 | |
| 2004/0212776 A1 | 10/2004 | Spitzer et al. | |
| 2004/0227703 A1 | 11/2004 | Lamvik et al. | |
| 2005/0046954 A1 | 3/2005 | Achtner | |
| 2006/0056069 A1 | 3/2006 | Kao | |
| 2006/0098153 A1 | 5/2006 | Silkkerveer et al. | |
| 2006/0119539 A1 | 6/2006 | Kato et al. | |
| 2008/0198097 A1 | 8/2008 | Ishino et al. | |
| 2008/0239499 A1 | 10/2008 | Fukuda | |
| 2009/0115968 A1 | 5/2009 | Sugiyama | |
| 2009/0237917 A1 | 9/2009 | Kutnyak | |
| 2009/0243970 A1 | 10/2009 | Kato et al. | |
| 2010/0073593 A1 | 3/2010 | Sasaki et al. | |
| 2010/0091031 A1 | 4/2010 | Tsujimoto | |
| 2010/0128107 A1 | 5/2010 | Tomita | |
| 2010/0195040 A1 | 8/2010 | Koganezawa | |
| 2010/0214635 A1 | 8/2010 | Sasaki et al. | |
| 2010/0226017 A1* | 9/2010 | Spaller ............... G02B 27/0172 359/630 | |
| 2010/0271710 A1* | 10/2010 | Ohashi ............... G02B 27/0025 359/687 | |
| 2011/0241975 A1 | 10/2011 | Mukawa et al. | |
| 2011/0248904 A1 | 10/2011 | Miyawaki et al. | |
| 2011/0248905 A1 | 10/2011 | Chosokabe et al. | |
| 2012/0044571 A1* | 2/2012 | Mukawa ............ G02B 27/0103 359/630 | |
| 2012/0056885 A1 | 3/2012 | Ishii et al. | |
| 2012/0127434 A1 | 5/2012 | Sasazaki et al. | |
| 2012/0154920 A1 | 6/2012 | Harrison et al. | |
| 2012/0200934 A1* | 8/2012 | Fujishiro ............ G02B 27/0172 359/630 | |
| 2012/0212484 A1* | 8/2012 | Haddick ............ G02B 27/0093 345/419 | |
| 2012/0218426 A1 | 8/2012 | Kaizu et al. | |
| 2012/0249891 A1 | 10/2012 | Sato et al. | |
| 2013/0003028 A1 | 1/2013 | Lin | |
| 2013/0128611 A1 | 5/2013 | Akutsu et al. | |
| 2013/0135749 A1 | 5/2013 | Akutsu et al. | |
| 2013/0242555 A1 | 9/2013 | Mukawa | |
| 2013/0278497 A1 | 10/2013 | Takagi et al. | |
| 2013/0300766 A1 | 11/2013 | Mukawa | |
| 2014/0009914 A1 | 1/2014 | Cho et al. | |
| 2014/0022284 A1 | 1/2014 | Chosokabe et al. | |
| 2014/0043320 A1 | 2/2014 | Tosaya et al. | |
| 2014/0104685 A1 | 4/2014 | Bohn et al. | |
| 2014/0104692 A1 | 4/2014 | Bickerstaff et al. | |
| 2014/0152531 A1 | 6/2014 | Murray et al. | |
| 2014/0266990 A1 | 9/2014 | Makino et al. | |
| 2014/0334010 A1 | 11/2014 | Mukawa | |
| 2014/0340286 A1 | 11/2014 | Machida et al. | |
| 2014/0340550 A1 | 11/2014 | Kaizu et al. | |
| 2014/0340609 A1 | 11/2014 | Taylor et al. | |
| 2014/0347252 A1 | 11/2014 | Miyawaki et al. | |
| 2015/0062699 A1 | 3/2015 | Hayashi | |
| 2015/0077312 A1 | 3/2015 | Wang | |
| 2015/0109679 A1 | 4/2015 | Mukawa et al. | |
| 2015/0116656 A1 | 4/2015 | Stevens et al. | |
| 2015/0138647 A1 | 5/2015 | Akutsu et al. | |
| 2015/0226970 A1 | 8/2015 | Mukawa | |
| 2015/0229897 A1 | 8/2015 | Mukawa | |
| 2015/0235620 A1 | 8/2015 | Takahota et al. | |
| 2015/0260994 A1 | 9/2015 | Akutsu et al. | |
| 2015/0260995 A1 | 9/2015 | Mukawa | |
| 2015/0269784 A1 | 9/2015 | Miyawaki et al. | |
| 2015/0277125 A1 | 10/2015 | Hirano et al. | |
| 2015/0277126 A1 | 10/2015 | Hirano et al. | |
| 2015/0288954 A1 | 10/2015 | Sasazaki et al. | |
| 2015/0338660 A1 | 11/2015 | Mukawa | |
| 2015/0346494 A1 | 12/2015 | Tanaka et al. | |
| 2015/0362735 A1 | 12/2015 | Akutsu et al. | |
| 2015/0370075 A1 | 12/2015 | Ato et al. | |
| 2016/0004102 A1 | 1/2016 | Nisper et al. | |
| 2016/0041394 A1 | 2/2016 | Tanaka et al. | |
| 2016/0062123 A1 | 3/2016 | Tanaka et al. | |
| 2016/0097931 A1 | 4/2016 | Takahota et al. | |
| 2016/0109712 A1 | 4/2016 | Harrison et al. | |
| 2016/0147069 A1 | 5/2016 | Tanaka et al. | |
| 2016/0154243 A1 | 6/2016 | Aiki | |
| 2017/0052379 A1 | 2/2017 | Yang et al. | |
| 2017/0069140 A1 | 3/2017 | Mukawa | |
| 2017/0115112 A1 | 4/2017 | Srocka et al. | |
| 2017/0115492 A1 | 4/2017 | Miyawaki et al. | |

(56) References Cited

U.S. PATENT DOCUMENTS

| | | | |
|---|---|---|---|
| 2017/0184857 A1 | 6/2017 | Ato et al. | |
| 2017/0322420 A1 | 11/2017 | Machida et al. | |
| 2018/0136472 A1 | 5/2018 | Tanaka et al. | |
| 2018/0211449 A1 | 7/2018 | Mukawa | |

FOREIGN PATENT DOCUMENTS

| | | | | |
|---|---|---|---|---|
| CN | 102375235 A | 3/2012 | | |
| CN | 102910127 A | 2/2013 | | |
| EP | 0 679 919 A2 | 11/1995 | | |
| EP | 0 716 329 A1 | 6/1996 | | |
| EP | 0 908 754 A2 | 4/1999 | | |
| EP | 1 191 411 A2 | 3/2002 | | |
| EP | 1 267 197 A2 | 12/2002 | | |
| EP | 1860612 A2 | 11/2007 | | |
| EP | 2 421 276 A2 | 2/2012 | | |
| GB | 2 413 717 A | 11/2005 | | |
| JP | 62-105184 A | 5/1987 | | |
| JP | 05-134208 A | 5/1993 | | |
| JP | 06-003641 A | 1/1994 | | |
| JP | H07-72420 A | 3/1995 | | |
| JP | 07-115607 A | 5/1995 | | |
| JP | 07-318850 A | 12/1995 | | |
| JP | 08-082762 A | 3/1996 | | |
| JP | 08-166557 A | 6/1996 | | |
| JP | 08-191462 A | 7/1996 | | |
| JP | 09-049999 A | 2/1997 | | |
| JP | 09-133876 A | 5/1997 | | |
| JP | 10-104548 A | 4/1998 | | |
| JP | 10-206786 A | 8/1998 | | |
| JP | 2000-352690 A | 12/2000 | | |
| JP | 2002-049021 A | 2/2002 | | |
| JP | 2002/341792 | * 11/2002 | ........... | G02F 1/1333 |
| JP | 2002-341792 A | 11/2002 | | |
| JP | 2004/139132 | * 5/2004 | ............ | G02B 25/00 |
| JP | 2004-139132 A | 5/2004 | | |
| JP | 2004-233867 A | 8/2004 | | |
| JP | 2005-099788 A | 4/2005 | | |
| JP | 2006-317604 A | 11/2006 | | |
| JP | 2007-086500 A | 4/2007 | | |
| JP | 2008-224850 A | 9/2008 | | |
| JP | 2010-039441 A | 2/2010 | | |
| JP | 2012-042654 A | 3/2012 | | |
| JP | 2012/063633 | * 3/2012 | ............ | G02B 27/02 |
| JP | 2012-063633 A | 3/2012 | | |
| JP | 2013-045020 A | 3/2013 | | |
| WO | WO 2013/076994 | * 5/2013 | ............ | G02B 27/02 |
| WO | WO 2013/076994 A1 | 5/2013 | | |

OTHER PUBLICATIONS

Chinese Office Action dated May 22, 2018 in connection with Chinese Application No. 201480002217.4 and English translation thereof.
Partial European Search Report dated Jan. 27, 2017 in connection with European Application No. 14827065.5.
Partial European Search Report dated Feb. 15, 2017 in connection with European Application No. 14825860.1.
Extended European Search Report dated Apr. 12, 2017 in connection with European Application No. 14825860.1.
Chinese Office Action dated Aug. 3, 2017 in connection with Chinese Application No. 201480002757.2 and English translation thereof.
European communication Pursuant to Article 94(3) EPC dated Jul. 16, 2018 in connection with European Application No. 14825860.1.
Japanese Office Action dated Nov. 27, 2018 in connection with Japanese Application No. 2015-511197, and English translation thereof.
Partial European Search Report dated Dec. 21, 2018 in connection with European Application No. 18191653.7.
Extended European Search Report dated Mar. 29, 2019 in connection with European Application No. 18191653.7.

* cited by examiner

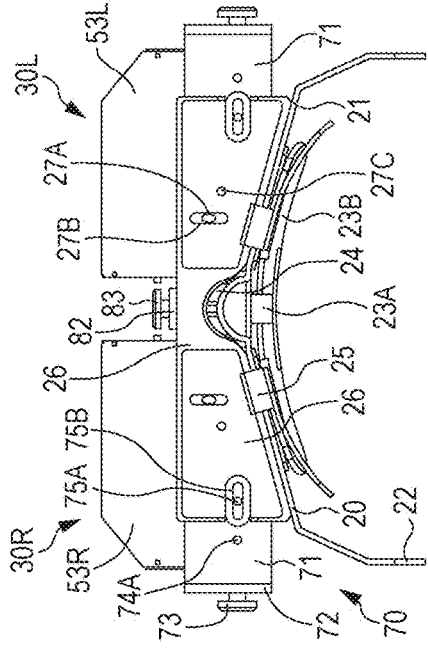
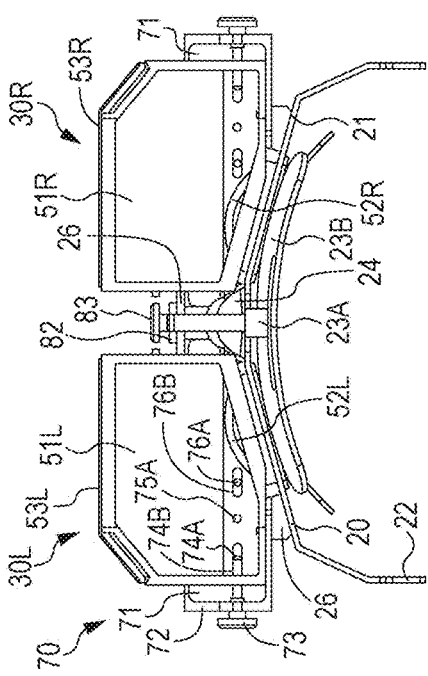
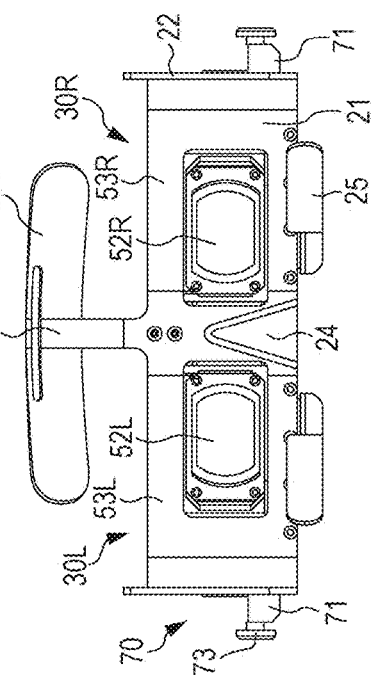

DISPLAY APPARATUS

CROSS REFERENCE TO RELATED APPLICATIONS

This is a U.S. National Stage Application under 35 U.S.C. § 371, based on International Application No. PCT/JP2014/063032, filed May 16, 2014, which claims priority to Japanese Patent Application JP 2013-147749, filed Jul. 16, 2013, each of which is hereby incorporated by reference in its entirety.

TECHNICAL FIELD

The present disclosure relates to a display apparatus. More specifically, the present disclosure relates to a display apparatus which can be used, for example, as a head mounted display (HMD).

BACKGROUND ART

A virtual image display apparatus (display apparatus) to make an observer observe a two-dimensional image, which is formed by an image forming apparatus, as an enlarged virtual image with a virtual image optical system has been known, for example, from JP 5-134208 A.

In the virtual image display apparatus disclosed in JP 5-134208 A, a liquid crystal display unit is illuminated by light from a light source which light is collimated by a lens through a polarizing plate and image light of the illuminated liquid crystal display unit is collected at a first focal point by a lens group. Then, the collected light is reflected by a concave mirror, is collected at a second focal point on a front surface of the lens of a pupil through the polarizing plate, and reaches a retina. Accordingly, it is possible for a user to observe an image.

Also, the following head mounted display has been known, for example, from FIG. 6 in JP 10-206786 A. That is, a half mirror and a concave mirror are provided in a front position of a right eye of an observer, a concave mirror formed as a concave-shape with respect to the half mirror and the observer is provided in a front position of a left eye of the observer, and in an upper position of the half mirror, an image display panel (image forming apparatus) is arranged.

CITATION LIST

Patent Document

Patent Document 1: JP 5-134208 A
Patent Document 2: JP 10-206786 A

SUMMARY OF THE INVENTION

Problems to be Solved by the Invention

Incidentally, in the technique disclosed in JP 5-134208 A, since a plurality of optical systems (lens, lens group, and concave mirror) is included, the virtual image display apparatus is still large as a virtual image display apparatus and is not adequate in a point of a compact size and light weight. Also, in the technique disclosed in JP 10-206786 A, an image display panel (image forming apparatus) is arranged at an upper position of each of the two half mirrors. However, in a case of increasing sizes of the image display panels, it may become difficult to arrange the two image display panels.

Thus, a purpose of the present disclosure is to provide a display apparatus including an image forming apparatus, which includes a simple configuration and structure to realize a large view angle with a compact size and light weight, and an image display apparatus which can easily deal with an increase in a size of the image forming apparatus.

Solutions to Problems

A display apparatus of the present disclosure to realize the above purpose is a display apparatus including: (1) a frame; and (2) an image display apparatus for a left eye and an image display apparatus for a right eye which are attached to the frame, wherein each image display apparatus includes (A) an image forming apparatus, and (B) an optical system configured to guide an image from the image forming apparatus to a pupil of an observer, the optical system includes a reflecting mirror configured to reflect the image from the image forming apparatus and a lens group which is arranged between the pupil of the observer and the reflecting mirror and into which the image reflected by the reflecting mirror becomes incident, when it is assumed that a direction of the image forming apparatus which direction corresponds to a first direction of the image is an X-direction, a direction of the image forming apparatus which direction corresponds to a second direction, which is different from the first direction, of the image is a Y-direction, the image forming apparatus is curved in the X-direction or the Y-direction, or in the X-direction and the Y-direction, and a normal of the reflecting mirror included in the optical system of the image display apparatus for a left eye and a normal of the reflecting mirror included in the optical system of the image display apparatus for a right eye intersect with each other in a space on an opposite side of the observer with respect to the reflecting mirror.

Effects of the Invention

In the display apparatus of the present disclosure, since an image forming apparatus is curved, for example, a difference between an optical path length of light emitted from a center part of the image forming apparatus and an optical path length of light emitted from an edge part in a display region of the image forming apparatus can be reduced. Thus, a large view angle can be realized as well as a compact size and light weight. In addition, a normal of a reflecting mirror included in an optical system of an image display apparatus for a left eye and a normal of a reflecting mirror included in an optical system of an image display apparatus for a right eye intersect with each other in a space on an opposite side of an observer with respect to the reflecting mirrors. Thus, it is possible to arrange two image forming apparatuses side by side easily with high flexibility in designing. Note that an effect described in the present description is just an example and is not a limitation. There may be an additional effect.

BRIEF DESCRIPTION OF DRAWINGS

FIG. 14A, FIG. 14B, FIG. 14C, and FIG. 14D are respectively a bottom view, a top view, a right side view, and a rear view of the display apparatus of the first embodiment.

MODE FOR CARRYING OUT THE INVENTION

In the following, the present disclosure will be described based on embodiments with reference to the drawings. However, the present disclosure is not limited to the embodiments. Various numerical values or materials in the embodiments are examples. Note that description will be made in the following order.

1. General description of display apparatus of present disclosure
2. First embodiment (display apparatus of present disclosure)
3. Second embodiment (modification of first embodiment)
4. Third embodiment (modification of second embodiment)
5. Fourth embodiment (modification of first embodiment to third embodiment) and the like General Description of Display Apparatus of Present Disclosure In the display apparatus of the present disclosure, a normal of a reflecting mirror included in an optical system of an image display apparatus for a left eye and a normal of a reflecting mirror included in an optical system of an image display apparatus for a right eye intersect with each other in a space lower than a virtual plane (xy plane described in the following) including both pupils of an observer and an infinite distance.

Figure 7:
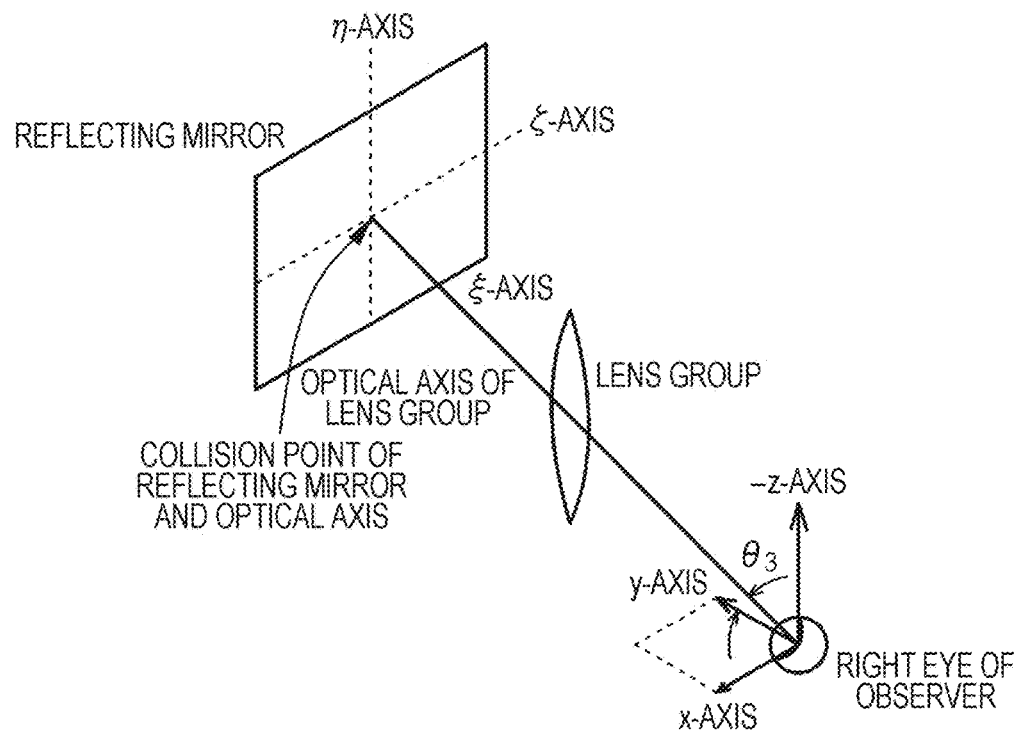
FIG. 7 is a conceptual diagram of the reflecting mirror or the like which diagram is for describing an arrangement state of the reflecting mirror included in the optical system.
Figure 8A:
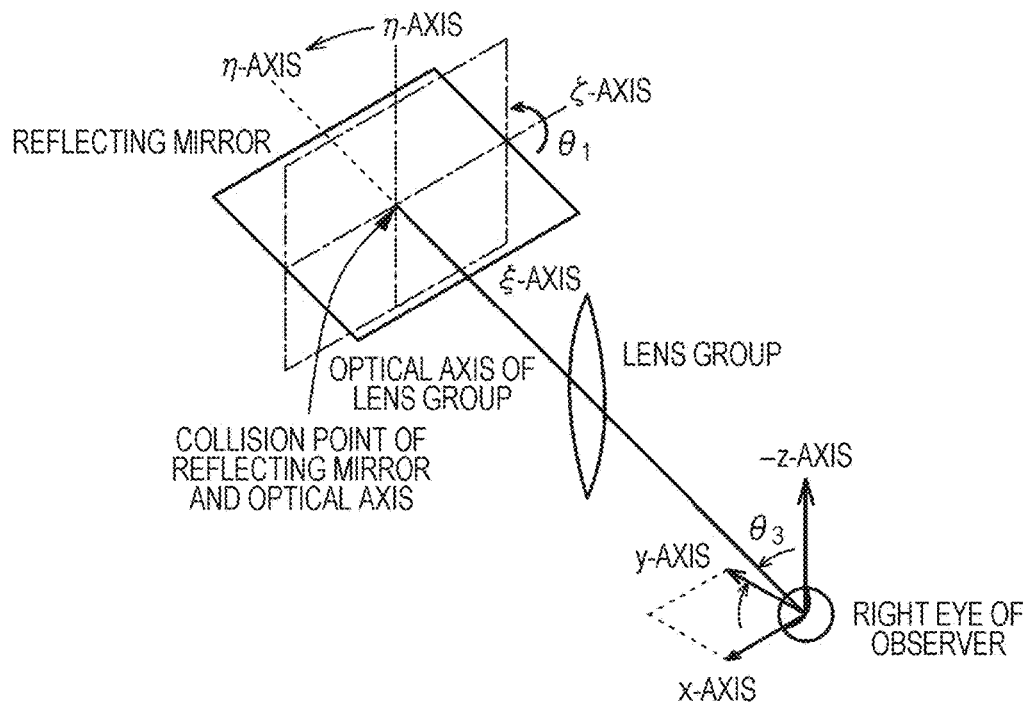
FIG. 8A and FIG. 8B are, similarly to FIG. 7, conceptual diagrams of the reflecting mirror or the like each of which diagrams is for describing an arrangement state of the reflecting mirror included in the optical system.
Figure 8B:
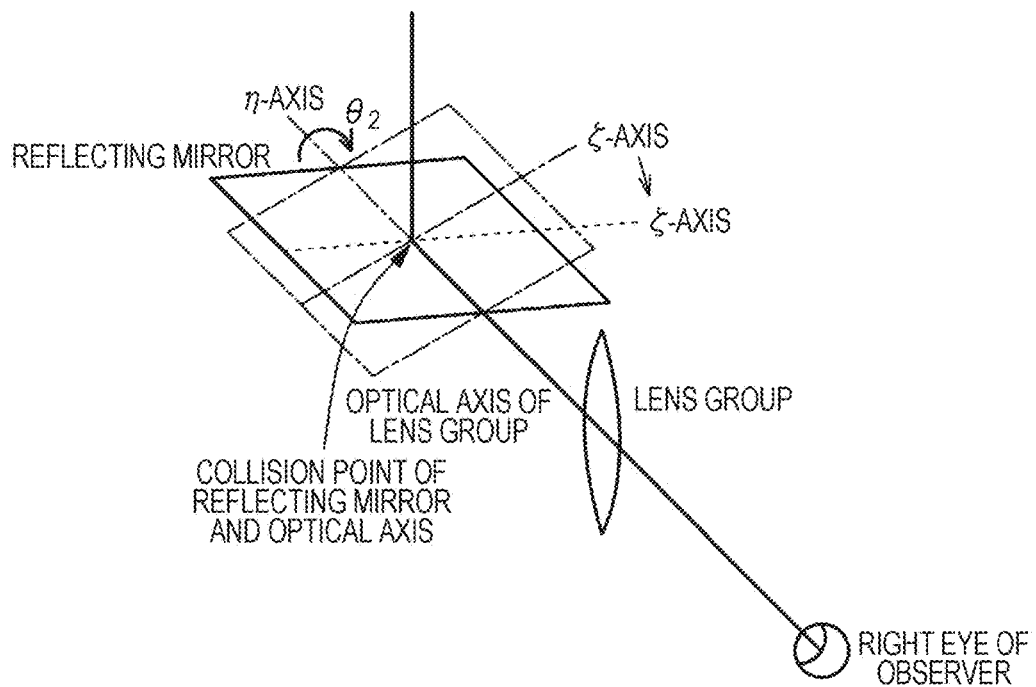

Then, in the above preferred embodiment of the display apparatus of the present disclosure, as illustrated in FIG. 7, FIG. 8A, and FIG. 8B, when it is assumed, with respect to an arrangement state of the reflecting mirror, that a virtual plane including both pupils of the observer and an infinite distance is an xy plane, a straight line which connects both of the pupils of the observer is an x-axis (specifically, axis which is straight line to connect both pupils of observer from pupil of right eye of observer to pupil of left eye thereof is x-axis), an optical axis of a right eye of the observer is a y-axis (specifically, axis which is orthogonal to x-axis and which moves toward lens group side is y-axis), a point on the reflecting mirror at which point an optical axis (main optical axis) of the lens group included in the optical system of the image display apparatus for a right eye collides with the reflecting mirror is a "collision point of a reflecting mirror for a right eye and an optical axis", and the reflecting mirror included in the optical system of the image display apparatus for a right eye is arranged in parallel with (at right angle with) an xz plane (see FIG. 7), and when it is further assumed that an axis on the reflecting mirror which axis passes through the collision point of a reflecting mirror for a right eye and an optical axis and is in parallel with the xy plane is a ζ-axis and an axis on the reflecting mirror which axis passes through the collision point of a reflecting mirror for a right eye and an optical axis and is orthogonal to the ζ-axis is an η-axis (see FIG. 7), a plane mirror included in the optical system of the image display apparatus for a right eye is rotated for an angle $\theta_1 = 45° \pm 5°$ with the ζ-axis as a center and with an upper part of the plane mirror being rotated in a direction away from the observer (see dashed-dotted line in FIG. 8A for state of reflecting mirror and axis before rotation and see solid line and dotted line in FIG. 8A for state of reflecting mirror and axis after rotation) and is also rotated for an angle $\theta2=7°$ to $21°$ with the η-axis as a center and with a right end part of the plane mirror being rotated in the direction away from the observer (see dashed-dotted line in FIG. 8B for reflecting mirror and axis before rotation and see solid line and dotted line in FIG. 8B for reflecting mirror and axis after rotation), and the image forming apparatus and the optical system of the image display apparatus for a left eye and the image forming apparatus and the optical system of the image display apparatus for a right eye are arranged in a mirror-symmetrical manner with respect to a virtual plane which passes through a midpoint of a line segment to connect both of the pupils of the observer and is in parallel with a yz plane. Moreover, when it is assumed that an axis orthogonal to the ζ-axis and the η-axis is a ξ-axis, an example of a relationship between an angle $\theta3$ and the angle $\theta1$ and the angle $\theta2$ is indicated in the following table 1, the angle $\theta3$ being formed between a ξ'-axis, which is an axis of when the ξ-axis is projected on the xy plane, and the y-axis. It is assumed that the angle $\theta3$ in a (−x, y) quadrant is a positive value (see FIG. 7 and FIG. 8A). It is preferable that the optical axis (main optical axis) of the lens group intersects with a center of the pupil of the observer. Moreover, in the preferred embodiment, it is preferable that the image forming apparatus is arranged on an upper side of the reflecting mirror.

TABLE 1

| θ1 (degree) | θ2 (degree) | θ3 (degree) |
|---|---|---|
| 45 | 5 | 9 |
| 45 | 10 | 15 |
| 45 | 15 | 22 |
| 45 | 18 | 25 |
| 45 | 20 | 29 |

In a display apparatus of the present disclosure including various preferred embodiments described above, each image display apparatus further includes a supporting member to support an image forming apparatus. A supporting surface of the supporting member to support the image forming apparatus is curved in the X-direction or the Y-direction, or in the X-direction and the Y-direction. Thus, the image forming apparatus is curved. In such a manner, since the supporting member including the supporting surface curved in the X-direction and/or the Y-direction is included, it is possible to curve the image forming apparatus based on a simple configuration and structure. Note that the display apparatus of the present disclosure which apparatus includes such a configuration is referred to as a "display apparatus of a first configuration of the present disclosure" as a matter of convenience.

Then, in the display apparatus of the first configuration of the present disclosure, a degree of curvature in the X-direction of the supporting surface of the supporting member can be larger than a degree of curvature in the Y-direction thereof. That is, in a case where the degree of curvature is expressed by an average curvature radius, an average curvature radius in the X-direction of the supporting surface of the supporting member can be smaller than an average curvature radius in the Y-direction thereof. Here, the first direction or the X-direction corresponds to a horizontal direction of an image which reaches a pupil of an observer eventually. The second direction or the Y-direction corresponds to a vertical direction of the image which reaches the pupil of the observer eventually. The X-direction and the Y-direction may be orthogonal to each other or may not be orthogonal to each other. Moreover, in the display apparatus of the first configuration of the present disclosure which apparatus includes such a configuration, the supporting member includes a pressing member. An outer shape of the image forming apparatus is a rectangular shape and an outer peripheral part of the image forming apparatus which part is extended in the X-direction is fixed to the supporting member by the pressing member. Note that the outer peripheral part of the image forming apparatus indicates a region (so-called frame region) between an end part of the image forming apparatus and an end part of the display region of the image forming apparatus. It is also similar in the following. Alternatively, an outer shape of the image forming apparatus can be a rectangular shape and an outer peripheral part of the image forming apparatus which part is extended in the X-direction can be sandwiched by the supporting member. However, these configurations are not the limitation. There may be a case to fix the image forming apparatus to the supporting member by using an adhesive. The supporting member can be made, for example, from various kinds of plastic materials including an ABS resin and the like, a composite material such as UNILATE (registered trademark and is produced by UNITIKA LTD.) or FRP, carbon fiber, a metal material such as aluminum, or an alloy material.

Also, in the display apparatus of the present disclosure (including display apparatus of first configuration of present disclosure) which apparatus includes the above-described various preferred embodiments and configurations, each image display apparatus can include an apparatus of adjusting a distance between an image forming apparatus and a reflecting mirror to adjust a distance between the image forming apparatus and the reflecting mirror. Note that a display apparatus of the present disclosure which apparatus includes such a configuration is referred to as a "display apparatus of a second configuration of the present disclosure" as a matter of convenience. Here, since the apparatus of adjusting a distance between an image forming apparatus and a reflecting mirror is included, it becomes possible to deal with a difference in eyesight of observers adequately and easily with a simple configuration and structure, the difference being caused depending on the observers. Then, in the display apparatus of the second configuration of the present disclosure, a display control apparatus to control a size of a whole image from the image forming apparatus according to a distance between the image forming apparatus and the reflecting mirror can be further included. With respect to the distance between the image forming apparatus and the reflecting mirror, a distance detection apparatus to detect the distance between the image forming apparatus and the reflecting mirror is arranged in the apparatus of adjusting a distance between an image forming apparatus and a reflecting mirror. The distance detection apparatus only needs to be an adequate apparatus depending on a configuration and structure of the apparatus of adjusting a distance between an image forming apparatus and a reflecting mirror. The control of a size of a whole image can be a well-known control method such as performing enlargement/reduction of the size of the whole image by performing various kinds of signal processing (such as thinning processing or interpolation processing) on an image signal used for forming an image in the image forming apparatus.

Also, in the display apparatus of the present disclosure (including display apparatus of first configuration of present disclosure and display apparatus of second configuration of present disclosure) which apparatus includes the above-described various preferred embodiments and configurations, each image display apparatus can include an apparatus of adjusting a distance between a pupil and a lens group to adjust a distance between a lens group and a pupil of an observer. Note that a display apparatus of the present disclosure which apparatus includes such a configuration is referred to as a "display apparatus of a third configuration of the present disclosure" as a matter of convenience. Here, since the apparatus of adjusting a distance between a pupil and a lens group is included, it becomes possible to adjust and accommodate a distance between the pupil of the observer and the lens group adequately and easily with a simple configuration and structure.

Also, in the display apparatus of the present disclosure (including display apparatus of first configuration of present disclosure, display apparatus of second configuration of present disclosure, and display apparatus of third configuration of present disclosure) which apparatus includes the above-described various preferred embodiments and configurations, when it is assumed that an axis which passes through a predetermined position (such as collision point of an image forming apparatus and optical axis which will be described later) of the image forming apparatus and which is parallel in the X-direction is an X-axis and an axis which passes through a predetermined point (such as collision point of an image forming apparatus and an optical axis) of the image forming apparatus and which is parallel in the Y-direction is a Y-axis, the image display apparatus further includes a rotation apparatus to rotate the image forming apparatus with at least one of the X-axis, the Y-axis, and the Z-axis as a center. More specifically, there are a rotation apparatus to rotate the image forming apparatus with the X-axis as a center, a rotation apparatus to rotate the image forming apparatus with the Y-axis as a center, a rotation apparatus to rotate the image forming apparatus with the Z-axis as a center, a rotation apparatus to rotate the image forming apparatus with the X-axis and the Y-axis as a center, a rotation apparatus to rotate the image forming apparatus with the X-axis and the Z-axis as a center, a rotation apparatus to rotate the image forming apparatus with the Y-axis and the Z-axis as a center, and a rotation apparatus to rotate the image forming apparatus with the X-axis, the Y-axis, and the Z-axis as a center. Moreover, in the display apparatus of the present disclosure (including display apparatus of first configuration of present disclosure, display apparatus of second configuration of present disclosure, and display apparatus of third configuration of present disclosure) which apparatus includes such a configuration and the above-described embodiments and configurations, a moving apparatus to move the image forming apparatus in the X-direction with respect to the reflecting mirror can be further included. In the display apparatus of the present disclosure (including display apparatus of first configuration of present disclosure, display apparatus of second configuration of present disclosure, and display apparatus of third configuration of present disclosure) which apparatus includes these preferred embodiments and the above-described various preferred embodiments and configurations, an apparatus of adjusting a distance between image display apparatuses to adjust a distance between an image display apparatus for a left eye and an image display apparatus for a right eye can be further included. Since the apparatus of adjusting a distance between image display apparatuses is included, it becomes easy to deal with observers having different distances between pupils.

In the display apparatus of the present disclosure (including display apparatus of first configuration of present disclosure, display apparatus of second configuration of present disclosure, and display apparatus of third configuration of present disclosure) which apparatus includes the above-described various preferred embodiments and configurations, an outer shape of the image forming apparatus is a rectangular shape and a wiring line is extended to an external part from an outer peripheral part of the image forming apparatus which part is extended in the Y-direction. Here, an example of the wiring line includes a flexible printed wiring board (FPC). A connection part provided to the outer peripheral part of the image forming apparatus and the wiring line are connected to each other by a well-known method.

Moreover, in the display apparatus of the present disclosure (including display apparatus of first configuration of present disclosure, display apparatus of second configuration of present disclosure, and display apparatus of third configuration of present disclosure) which apparatus includes the above-described various preferred embodiments and configurations, one lens group includes three lenses. The second lens includes negative power. A refractive index of a material included in the second lens is higher than a refractive index of a material included in each of the first and the third lenses. Furthermore, the first lens and the third lens include positive power. A meniscus lens is preferably used as the second lens. The lens group is preferably a telecentric optical system. More specifically, a side of the reflecting mirror is preferably the telecentric optical system. Thus, even when a distance between the image forming apparatus and the optical system is adjusted by the apparatus of adjusting a distance between an image forming apparatus and a reflecting mirror, a change in an image which reaches a pupil of an observer can be controlled securely.

Moreover, in the display apparatus of the present disclosure (including display apparatus of first configuration of present disclosure, display apparatus of second configuration of present disclosure, and display apparatus of third configuration of present disclosure) which apparatus includes the above-described various preferred embodiments and configurations, the image forming apparatus may be an image forming apparatus of any type as long as the image forming apparatus has flexibility. However, an organic electroluminescence display apparatus (organic EL display apparatus) is preferably included. The organic EL display apparatus itself can be an organic EL display apparatus including a well-known configuration and structure.

Moreover, in the display apparatus of the present disclosure (including display apparatus of first configuration of present disclosure, display apparatus of second configuration of present disclosure, and display apparatus of third configuration of present disclosure) which apparatus includes the above-described various preferred embodiments and configurations, a frame can be mounted on a head of the observer. However, such a configuration is not the limitation. For example, the frame may be attached to an arm extended from a ceiling or a wall or may be attached to a movable robot arm. Also, a movement of a head of the observer may be detected by a sensor and movement of the frame may follow the movement of the head of the observer.

In a case where a frame is mounted on a head of an observer, the frame can be any type as long as a configuration and structure, in which mounting on the head of the observer and attachment of the image display apparatus are possible, are included. For example, a configuration including a front part arranged in front of the observer and a side part extended from both ends of the front part may be included. The image display apparatus is attached to the frame. More specifically, for example, the image display apparatus is attached to a holding member which is attached to a lower part of the front part and is extended substantially in a horizontal direction. Also, a forehead rest to contact with a forehead of an observer is preferably attached to an upper part of the front part in view of improvement in feeling of the observer with respect to attachment of the image display apparatus.

Moreover, in the display apparatuses of the present disclosure (hereinafter, these will be collectively referred to as "display apparatus and the like of present disclosure") which apparatus includes the display apparatus of the first configuration of the present disclosure, the display apparatus of the second configuration of the present disclosure, and the display apparatus of the third configuration of the present disclosure and includes the above-described preferred embodiments and configurations, an example of an overlap (view angle of both eyes) of a horizontal view in the image display apparatus for a left eye and a horizontal view in the image display apparatus for a right eye includes 45° to 100°.

In the display apparatus and the like of the present disclosure, an example of a length LX of a display region of the image forming apparatus in the X-direction includes 83 mm to 130 mm. An example of the number of pixels of the image forming apparatus includes 320×240, 432×240, 640×480, 1024×768, 1920×1080, 3840×2160 and the like. Also, an example of an aspect ratio includes 21:9 and the like in addition to 4:3 and 16:9. An example of a horizontal view angle (view angle of one eye) of the image display apparatus includes 100° to 120°.

Also, a point where an optical axis (main optical axis), reflected by a reflecting mirror, of the lens group collides with the image forming apparatus is assumed as a "collision point of an image forming apparatus and an optical axis". A virtual plane in contact with the collision point of an image forming apparatus and an optical axis is assumed as an XY plane. An outer shape of the display region of the image forming apparatus is assumed as a rectangular shape. Also, it is assumed that the X-direction and the Y-direction are orthogonal to each other. It is also assumed that an axis which passes through the collision point of an image forming apparatus and an optical axis and is in parallel with the X-direction is an X-axis and an axis which passes through the collision point of an image forming apparatus and which is in parallel with the Y-direction is a Y-axis. It is assumed that an (X, Y, Z) coordinate of the collision point of an image forming apparatus and an optical axis is (0, 0, 0). Accordingly, in a case of X>0, a value of (dZ/dX)Y=0 may be a positive value [that is, when value of X is increased in case of Y=0, value of Z may be increased monotonously]. In a case of Y=0 and when a value of X is increased in while a value of (dZ/dX)Y=0 becomes an arbitrary value, a value of Z may be increased eventually. Similarly, in a case of Y>0, a value of (dZ/dY)X=0 may be a positive value [that is, when value of Y is increased in case of X=0, value of Z may be increased monotonously]. In a case of X=0 and when a value of Y is increased while a value of (dZ/dY)X=0 becomes an arbitrary value, a value of Z may be increased eventually. An example of a curved state of the image forming apparatus includes a curved surface, a spherical surface, an ellipsoid of revolution, a hyperboloid of revolution, and a paraboloid of revolution which are expressed by a spherical-surface functions. Alternatively, when a curved state of the image forming apparatus is expressed by a function of ZX=f(X)Y=0 and ZY=f(Y)X=0, an example of these functions includes a circle, an ellipsoid, a hyperbola, a parabola, an an spherical-surface function, a polynomial of the third order or more, a two-petalled rose, a three-petalled rose, a four-petalled rose, a lemniscate, a limacon, a folium, a conchoid, a cissoid, a bell curve, a tractrix, a catenary, a cycloid, a trochoid, an asteroid, a parabola evolute, the Lissajous curve, the witch of Agnesi, an epicycloid, a cardioid, a hypocycloid, a clothoid curve, a clothoid curve, and a spiral. Alternatively, there may be an example in which the image forming apparatus is curbed along a side surface of a cylinder. When a degree of curvature of the image forming apparatus is expressed by an average curvature radius, a value of the average curvature radius may be fixed or may vary.

A display apparatus which includes image display apparatuses respectively including image forming apparatuses having different degrees of curvature may be prepared and an adequate display apparatus may be provided according to eyesight of an observer. Alternatively, a configuration and structure in which a degree of curvature of an image forming apparatus can be varied may be included. An example of a relationship between a radius of a side surface of a cylinder, of when it is assumed that an image forming apparatus is curved along the side surface of the cylinder, and a diopter value will be indicated in the following table 2, but the table is not the limitation.

TABLE 2

| Diopter value | Radius of side surface of cylinder |
| --- | --- |
| −3 | 59 mm |
| −2 | 68 mm |
| −1 | 80 mm |
| 0 | 100 mm |

First Embodiment

Figure 1:
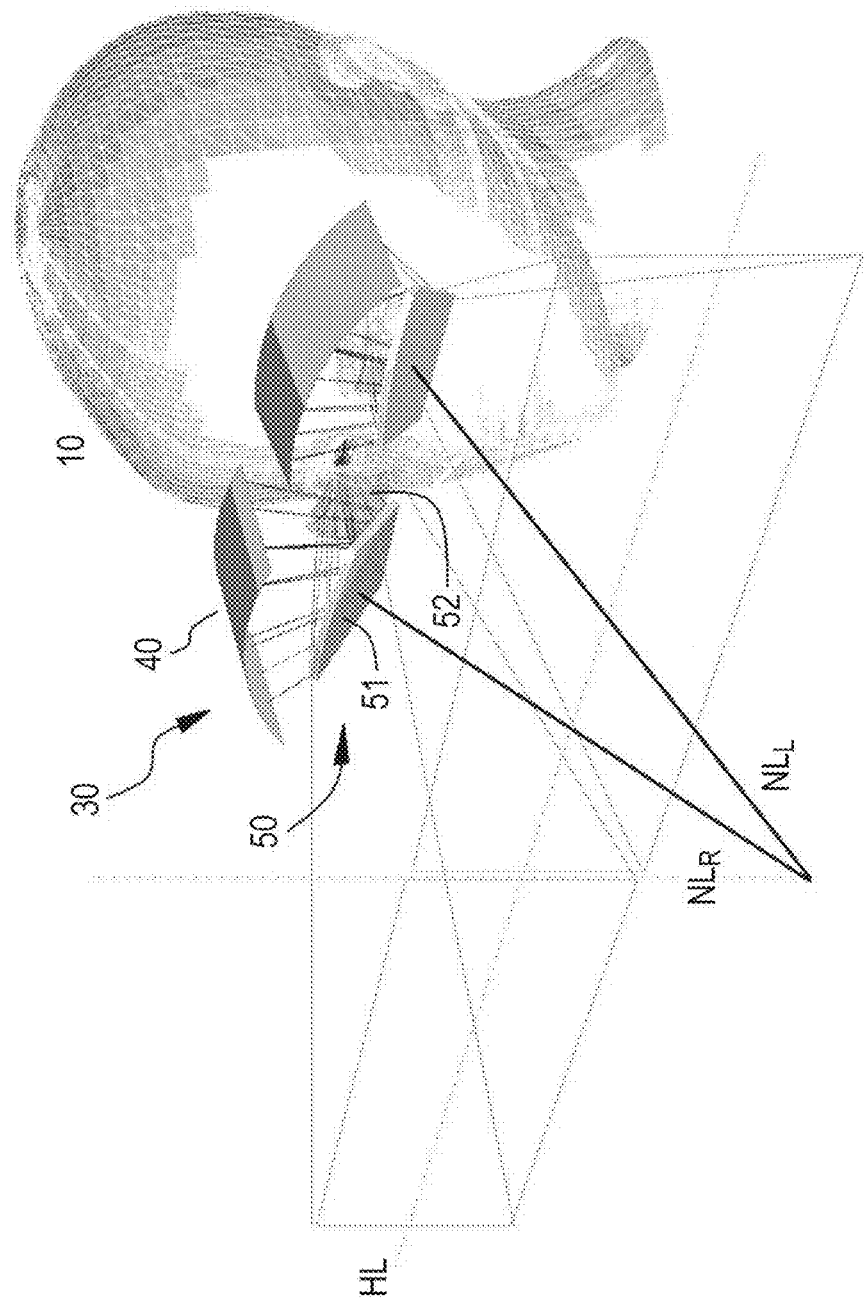
FIG. 1 is a perspective view of a main part of a display apparatus of when an observer wears the display apparatus.
Figure 2:
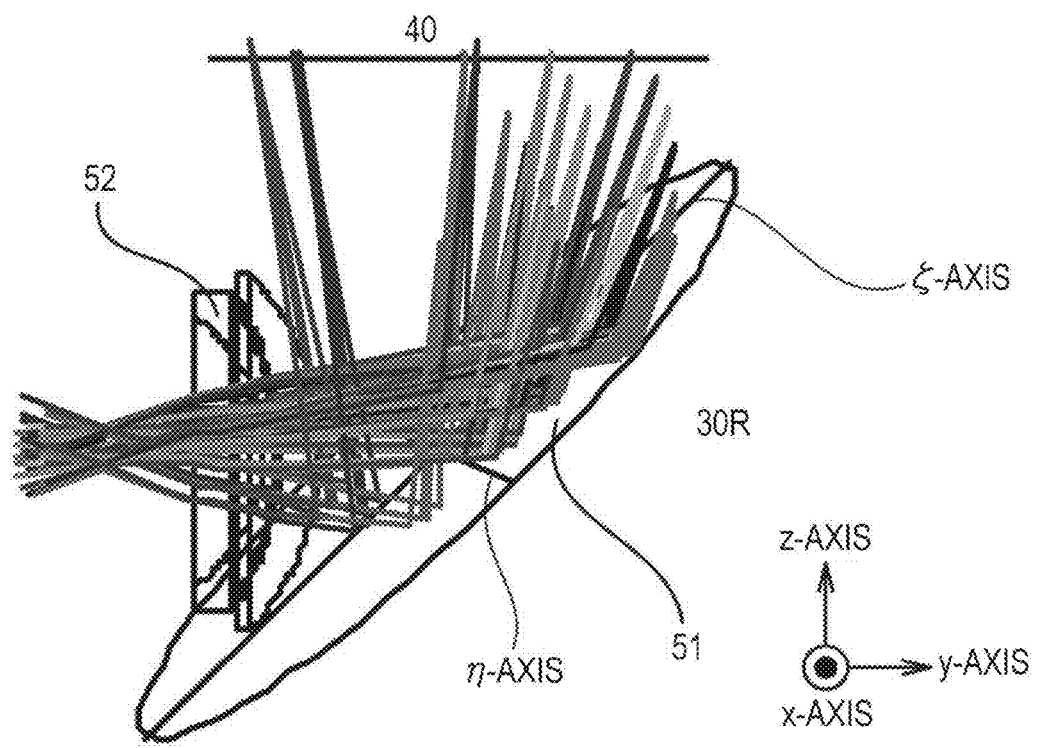
FIG. 2 is a view in which a plane mirror or the like included in an optical system of an image display apparatus for a right eye is seen in an x-axis direction.
Figure 3:
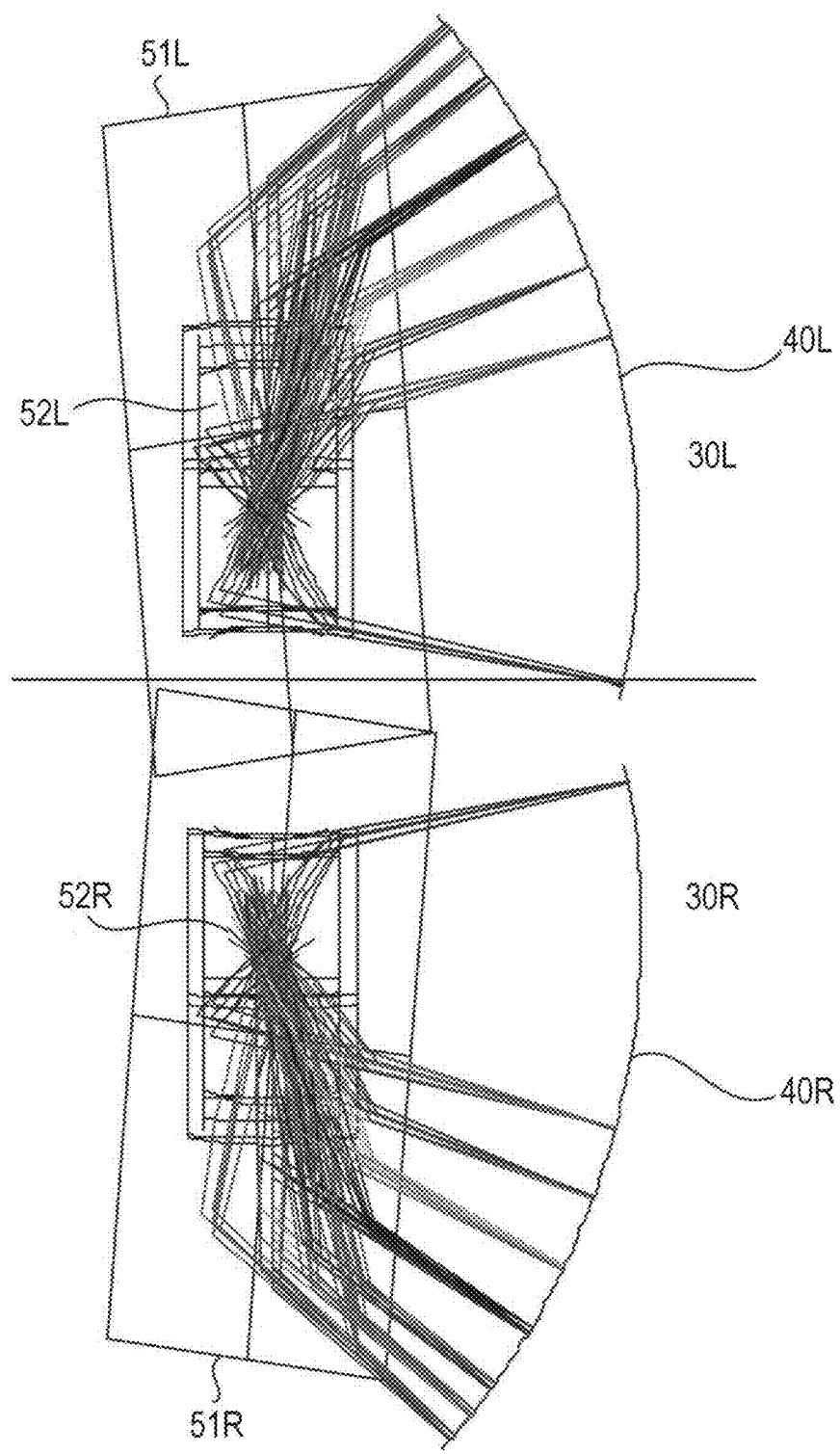
FIG. 3 is a conceptual diagram (perspective view) of an image forming apparatus and an optical system which are seen from a side of the observer.
Figure 4:
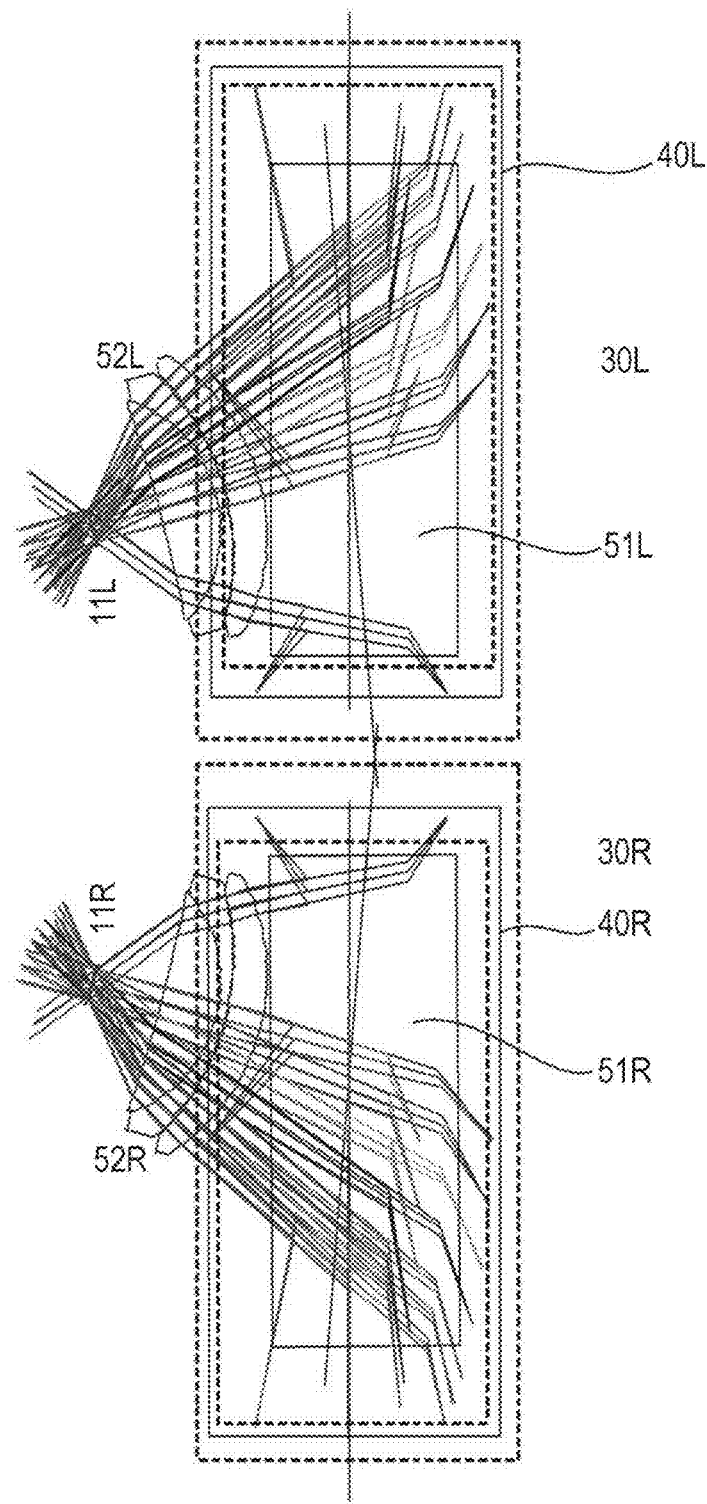
FIG. 4 is a conceptual diagram (perspective view) of the image forming apparatus and the optical system which are seen from above.
Figure 5A:
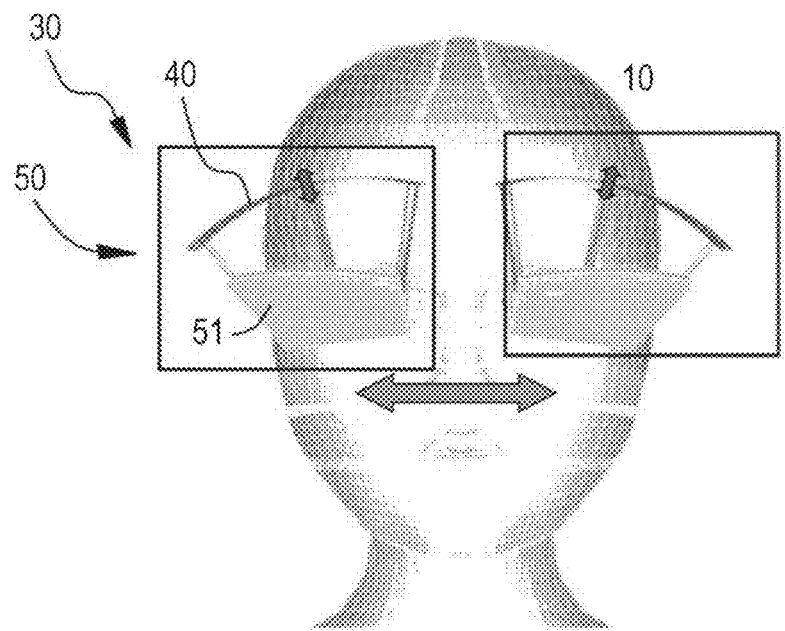
FIG. 5A and FIG. 5B are respectively a perspective view of a main part of a display apparatus of a first embodiment in which view the observer wearing the display apparatus is seen from the front and a perspective view of the main part of the display apparatus in which view the observer wearing the display apparatus is seen from a side.
Figure 5B:
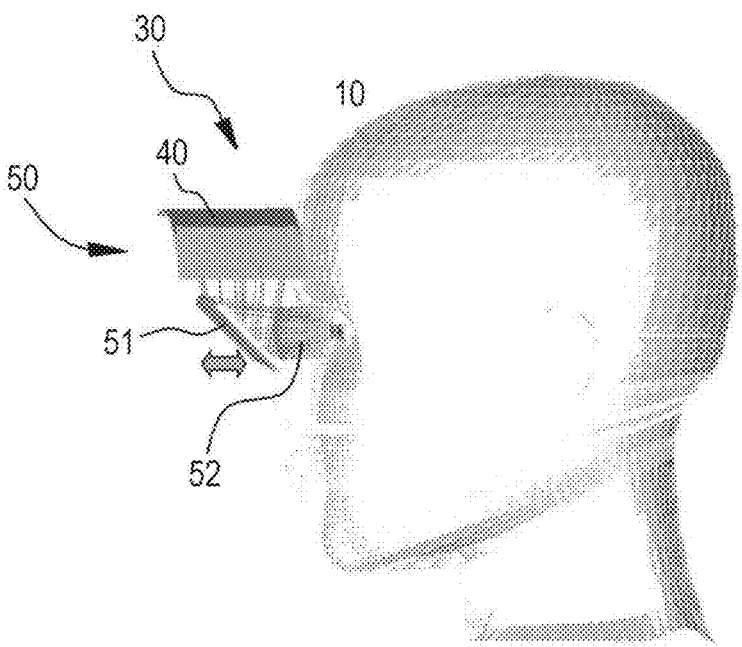
Figure 6A:
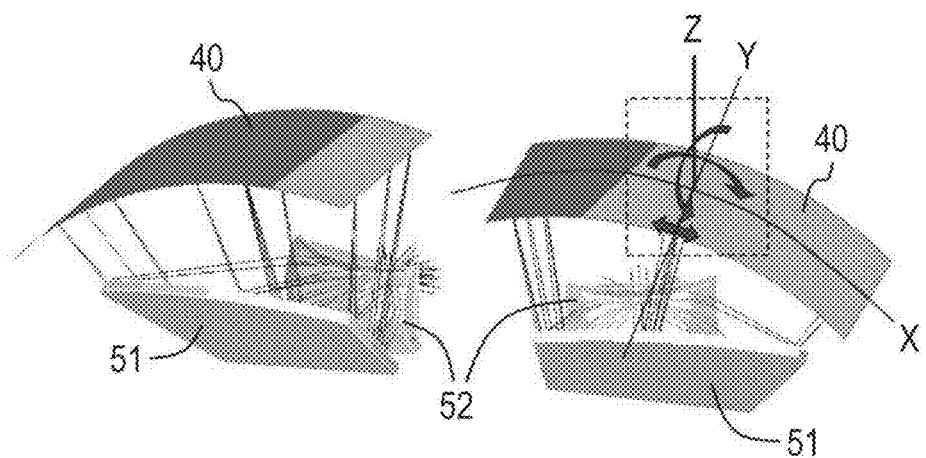
FIG. 6A and FIG. 6B are, with respect to the display apparatus of the first embodiment, respectively a perspective view of the image forming apparatus and the optical system which are seen in a direction toward the observer and a perspective view of the image forming apparatus and the optical system which are seen from the observer.
Figure 6B:
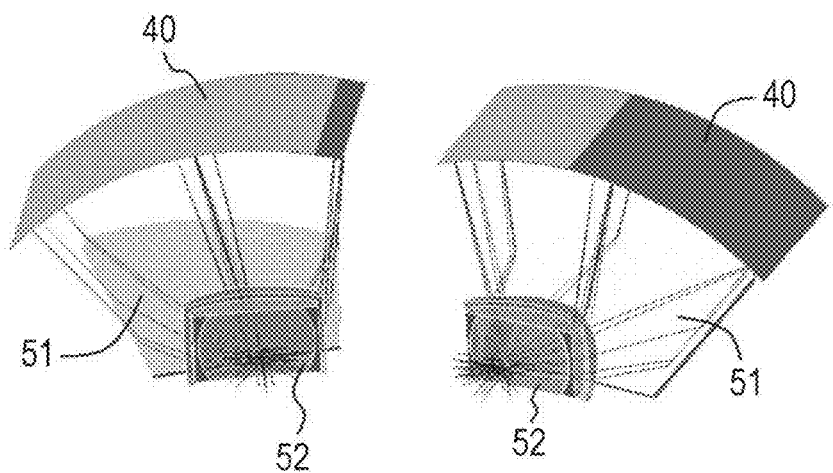

The first embodiment relates to a display apparatus of the present disclosure. More specifically, the first embodiment relates to a display apparatus of a first configuration of the present disclosure and a display apparatus of a third configuration of the present disclosure. A perspective view of a main part of a display apparatus of when an observer wears the display apparatus is illustrated in FIG. 1. A view of a plane mirror and the like included in an optical system of an image display apparatus for a right eye which mirror and the like is seen in an x-axis direction is illustrated in FIG. 2. A conceptual diagram (perspective view) of an image forming apparatus and an optical system which are seen from a side of the observer is illustrated in FIG. 3. A conceptual diagram (perspective view) of the image forming apparatus and the optical system which are seen from above is illustrated in FIG. 4. Also, a perspective view of the main part of the display apparatus of when the observer wearing the display apparatus is seen from the front is illustrated in FIG. 5A. A perspective view of the main part of the display apparatus of when the observer wearing the display apparatus is seen from a side is illustrated in FIG. 5B. A perspective view of the image forming apparatus and the optical system which are seen in a direction toward the observer is illustrated in FIG. 6A. A perspective view of the image forming apparatus and the optical system which are seen from the observer is illustrated in FIG. 6B. Note that in the drawings, there may be gradation in the image forming apparatus. However, there is no special meaning in the gradation.

Figure 9A:
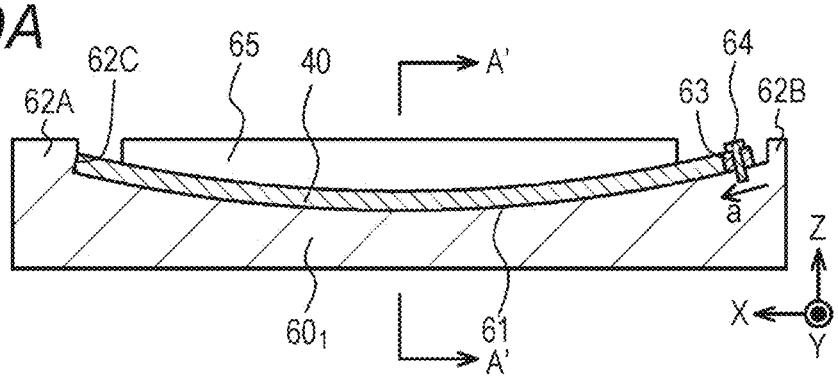
FIG. 9A is a schematic sectional view of a supporting member and an image forming apparatus included in the display apparatus of the first embodiment.
Figure 9B:
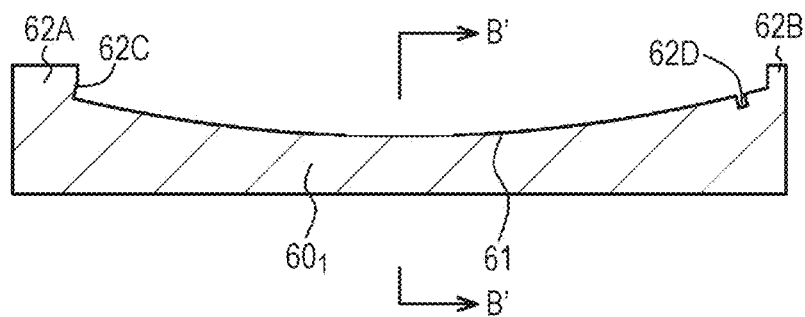
FIG. 9B is a schematic sectional view of the supporting member.
Figure 9C:
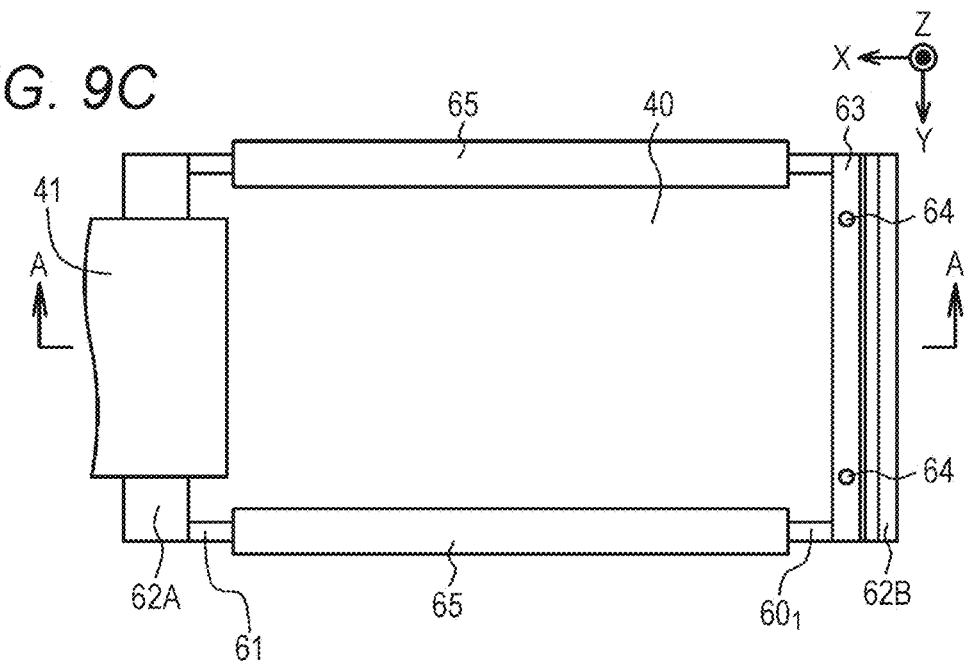
FIG. 9C is a schematic plane view of the supporting member and the image forming apparatus.
Figure 10A:
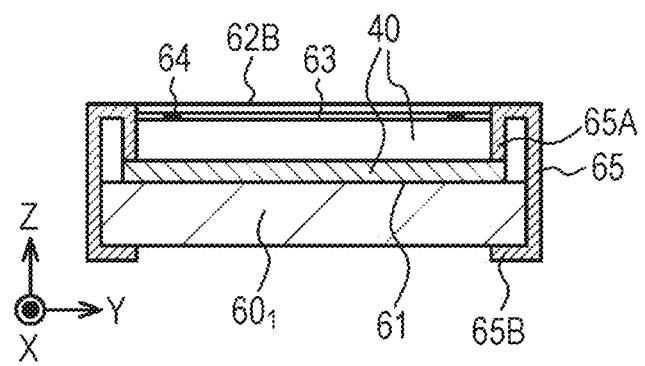
FIG. 10A and FIG. 10B are respectively a schematic sectional view, along an arrow A'-A' in FIG. 9A, of the supporting member and the image forming apparatus included in the display apparatus of the first embodiment and a schematic sectional view, along an arrow B'-B' in FIG. 9B, of the supporting member.
Figure 10B:
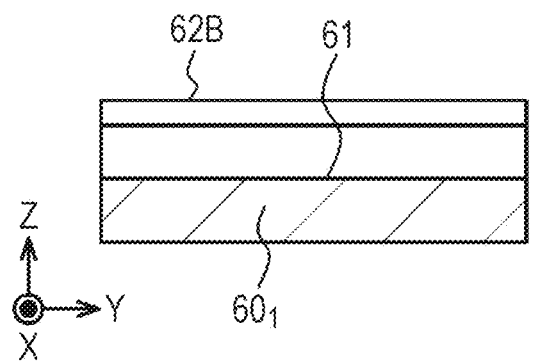
Figure 13:
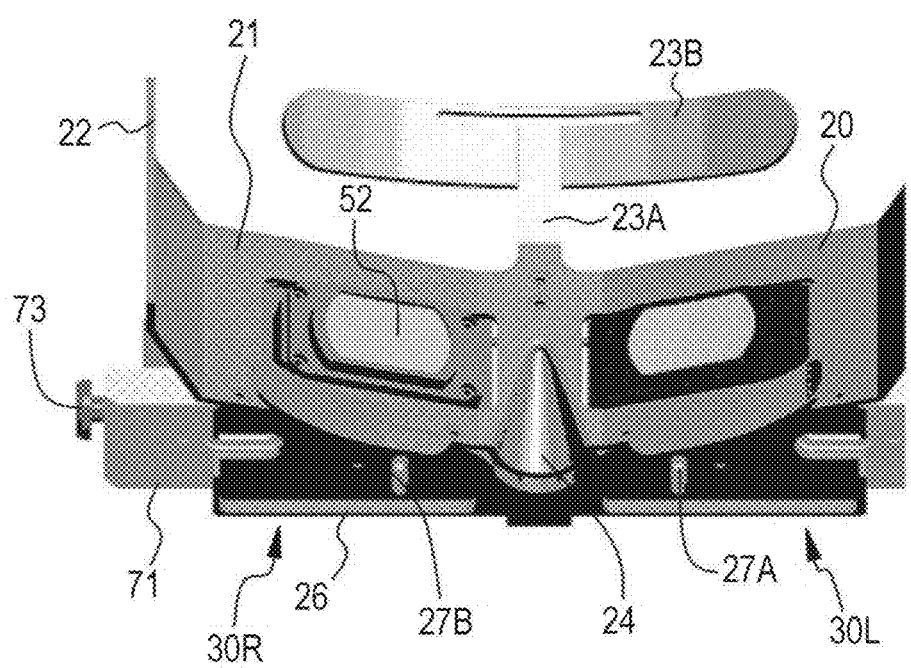
FIG. 13 is a perspective view of a part of the display apparatus of the first embodiment.

Moreover, schematic sectional views of a supporting member and the image forming apparatus are illustrated in FIG. 9A and FIG. 10A. Schematic sectional views of the supporting member are illustrated in FIG. 9B and FIG. 10B. A schematic plane view of the supporting member and the image forming apparatus is illustrated in FIG. 9C. Note that FIG. 9A and FIG. 9B are schematic sectional views along an arrow A-A in FIG. 9C. FIG. 10A and FIG. 10B are schematic sectional views along an arrow A'-A' in FIG. 9A and an arrow B'-B' in FIG. 9B. Also, a perspective view of a part of the display apparatus of the first embodiment is illustrated in FIG. 13. In FIG. 13, a reflecting mirror, an image forming apparatus, and the like are not illustrated. Moreover, a bottom view, a top view, a right side view, and a rear view of the display apparatus of the first embodiment are respectively illustrated in FIG. 14A, FIG. 14B, FIG. 14C, and FIG. 14D. However, in order to simplify the drawings, a part of components of an image forming apparatus or the display apparatus is not illustrated.

The display apparatus of the first embodiment includes (1) a frame 20 and (2) an image display apparatus for a left eye 30L and an image display apparatus for a right eye 30R which are attached to the frame 20. Each of the image display apparatuses 30L and 30R includes (A) an image forming apparatus 40 and (B) an optical system 50 to lead an image from the image forming apparatus 40 to a pupil 11 (11L or 11R) of an observer 10. The frame 20 of the display apparatus of the first embodiment is mounted on a head of the observer 10. More specifically, the display apparatus of the first embodiment is a head mounted display (HMD).

The optical system 50 includes a reflecting mirror 51, which reflects an image from the image forming apparatus 40, and a lens group 52 which is arranged between the pupil 11 of the observer 10 and the reflecting mirror 51 and into which the image reflected by the reflecting mirror 51 becomes incident. Also, when it is assumed that a direction of the image forming apparatus 40 which direction corresponds to a first direction (specifically, horizontal direction of image) of the image is an X-direction and a direction of the image forming apparatus 40 which direction corresponds to a second direction (specifically, vertical direction of image), which is different from the first direction, of the image is a Y-direction, the image forming apparatus 40 is curved in the X-direction or the Y-direction, or in the X-direction and the Y-direction. More specifically, in the first embodiment, the image forming apparatus 40 is curved in the X-direction. In addition, a normal NLL of the reflecting mirror 51 included in the optical system 50 of the image display apparatus for a left eye 30L and a normal NLR of the reflecting mirror 51 included in the optical system 50 of the image display apparatus for a right eye 30R intersect with each other in a space on an opposite side of the observer 10 with respect to the reflecting mirror 51 (see FIG. 1). Moreover, the normal NLL of the reflecting mirror 51 included in the optical system 50 of the image display apparatus for a left eye 30L and the normal NLR of the reflecting mirror 51 included in the optical system 50 of the image display apparatus for a right eye 30R intersect with each other in a space lower than a virtual plane (xy plane) including both pupils of the observer 10 and an infinite distance (see FIG. 1). Note that in FIG. 1, the virtual plane including both of the pupils of the observer 10 and the infinite distance is indicated by a reference sign "HL". The image forming apparatus 40 is arranged on an upper side of the reflecting mirror 51. An arrangement state of the reflecting mirror 51 is illustrated in FIG. 7, FIG. 8A, and FIG. 8B. More specifically, in the first embodiment, a length LX of the display region of the image forming apparatus 40 is set as 100 mm. Also, angles are set in the following manner: an angle θ1=45°; an angle θ2=10°; and an angle θ3=15°. Note that in the embodiment, a collision point of a reflecting mirror and an optical axis is included in the xy plane. With such a setting condition, there is a gap of about 15 mm between the image forming apparatus 40 included in the image display apparatus for a left eye 30L and the image forming apparatus 40 included in the image display apparatus for a right eye 30R and the two image forming apparatuses can be arranged side by side. Also, when the length LX of the display region of the image forming apparatus 40 is 126 mm and the angles are in the following manner: the angle θ1=45°; the angle θ2=18°; and the angle θ3=25°, there is a gap of about 15 mm between the image forming apparatus 40 included in the image display apparatus for a left eye 30L and the image forming apparatus 40 included in the image display apparatus for a right eye 30R and the two image forming apparatuses can be arranged side by side.

In a case of the angle θ1=45°, the angle θ2=0°, and the angle θ3=0° and when the length LX in the X-direction of the display region of each image forming apparatus 40 is 100 mm and a distance between an optical axis of a left eye of the observer and an optical axis of a right eye thereof is 65 mm, the image forming apparatus 40 included in the image display apparatus for a left eye 30L and the image forming apparatus 40 included in the image display apparatus for a right eye 30R overlap with each other for about 35 mm [=50+50−65 (mm)] and it is not possible to arrange the two image forming apparatuses side by side.

In the first embodiment, each image display apparatus 30 further includes a supporting member 601 to support the image forming apparatus 40. A supporting surface 61 of the supporting member 601 to support the image forming apparatus 40 is curved in the X-direction or the Y-direction, or in the X-direction and the Y-direction. More specifically, in the first embodiment, the supporting surface 61 is curved in the X-direction. Then, the image forming apparatus 40 is curved in the X-direction. More specifically, the image forming apparatus 40 is curved along the supporting surface 61 of the supporting member 601. Note that an outer shape of the image forming apparatus 40 and an outer shape of the display region of the image forming apparatus 40 are rectangular shapes. In such a manner, since the supporting member 601 including the supporting surface 61 curved in the X-direction and/or the Y-direction is included, it is possible to curve the image forming apparatus 40 with a simple configuration and structure.

More specifically, in an image display apparatus 30 of the first embodiment, a degree of curvature in the X-direction of the supporting surface 61 of the supporting member 601 is larger than a degree of curvature in the Y-direction thereof. That is, in a case where the degree of curvature is expressed by an average curvature radius, an average curvature radius in the X-direction of the supporting surface 61 of the supporting member 601 can be smaller than an average curvature radius in the Y-direction thereof. More specifically, a curvature radius in the X-direction of the supporting surface of the supporting member is 100 mm and a curvature radius in the Y-direction is infinity. Then, in the image display apparatus 30 of the first embodiment, in a case of X>0, a value of (dZ/dX)Y=0 is a positive value. That is, in a case of X>0 and Y=0 and when a value of X is increased, a value of Z is increased monotonously. Also, (dZ/dY)X=0=0. More specifically, the image forming apparatus 40 is curved along a side surface of a cylinder and a radius of the side surface of the cylinder is 100 mm. Also, as described later, an effective focal length of the lens group 52 is 56 mm. Note that a preferred relationship between the radius of the side surface of the cylinder and the effective focal length of the lens group 52 will be indicated in the following table 3.

TABLE 3

| Radius of side surface of cylinder (mm) | Effective focal length of lens group 52 (mm) |
|---|---|
| 50 | 28 |
| 100 | 56 |
| 146 | 67.2 |
| 238 | 95 |

Then, in the image display apparatus 30 of the first embodiment, the supporting member 601 includes a pressing member 65. As described above, an outer shape of the image forming apparatus 40 is a rectangular shape. An outer peripheral part of the image forming apparatus 40 which part is extended in the X-direction is fixed to the supporting member 601 by the pressing member 65.

More specifically, the supporting member 601 and the pressing member 65 are made from aluminum. A center part on an upper surface of the supporting member 601 corresponds to the supporting surface 61 and outer peripheral parts 62A and 62B of the supporting member 601 which parts are extended in the Y-direction are protruded compared to the supporting surface 61. Apart, which faces the supporting surface 61, of the outer peripheral part 62A is a contact surface 62C. On the contact surface 62C, one edge part of the image forming apparatus 40 which part is extended in the Y-direction is butted. Also, a fixing member 63 made from aluminum is fixed on the upper surface of the supporting member 601 by a screw 64, which is screwed into a screw part 62D formed in the upper surface of the supporting member 601, and is in touch with the other edge part of the image forming apparatus 40 which part is extended in the Y-direction. In the fixing member 63, a long hole through which the screw 64 passes (long hole elongated in X-direction) is provided. Here, the image forming apparatus 40 receives compression force in a direction of an arrow "a" in FIG. 9A by the fixing member 63. Accordingly, the image forming apparatus 40 is curved along the supporting surface 61 of the supporting member 601 without a gap.

One end part 65A of the pressing member 65 presses the outer peripheral part of the image forming apparatus 40 which part is extended in the X-direction. The other end part 65B of the pressing member 65 is engaged with a bottom surface of the supporting member 601 extended in the X-direction. Accordingly, the outer peripheral part of the image forming apparatus 40 which part is extended in the X-direction is fixed to the supporting member 601 by the pressing member 65.

Note that there may be a case where a lower surface of the image forming apparatus 40 and the supporting surface 61 of the supporting member 601 are fixed by using an adhesive. In this case, the pressing member 65 can be omitted.

Also, a wiring line 41, specifically, a flexible printed wiring board (FPC) is extended to an external part from an outer peripheral part of the image forming apparatus 40 which part is extended in the Y-direction. A connection part provided in the outer peripheral part of the image forming apparatus 40 and the wiring line 41 are connected to each other by a well-known method. In FIG. 9C, a state in which the wiring line 41 is extended from one side of the outer peripheral part of the image forming apparatus 40 which part is extended in the Y-direction is illustrated. However, the wiring line 41 may be extended from both sides of the outer peripheral part of the image forming apparatus 40 which part is extended in the Y-direction.

In the display apparatus of the first embodiment, the image forming apparatus 40 specifically includes an organic electroluminescence display apparatus (organic EL display apparatus) including a well-known configuration and structure. Note that the organic EL display apparatus includes a first substrate, a second substrate, and a great number of light emitting parts sandwiched between the first substrate and the second substrate. A thickness of the image forming apparatus 40 is a thickness with which curvature along the supporting surface of the supporting member 601 without a gap is possible. The thickness is, for example, 0.5 mm or thinner and is, for example, 0.2 mm to 0.5 mm. Also, the number of pixels is set as 1920×1080.

As illustrated in FIG. 13, FIG. 14A, FIG. 14B, FIG. 14C, and FIG. 14D, in the display apparatus of the first embodiment, the image display apparatus for a left eye 30L and the image display apparatus for a right eye 30R are included. A horizontal view angle (view angle of one eye) in each image display apparatus 30 is set as 100°. An overlap (view angle of both eyes) of a horizontal view in the image display apparatus for a left eye 30L and a horizontal view in the image display apparatus for a right eye 30R is set as 70° and a hole horizontal view angle is set as 130°. The length LX in the X-direction of the display region of each image forming apparatus 40 is set as 100 mm. Also, a vertical view angle is set as 44°. Note that when mass of the lens group is "1", the view angle of one eye is set as 120°, the view angle of both eyes is set as 70°, and the whole horizontal view angle is set as 170°, and the length LX of the display region of each image forming apparatus 40 is set as 126 mm, the mass of the lens group becomes "4.6" and an effective focal length becomes 67.2 mm.

The frame 20 mounted on a head of the observer 10 is made from plastic and includes a front part 21 arranged in front of the observer 10 and a side part 22 extended from both ends of the front part. To a rear end part of the side part 22, a hole part 22A is provided. By threading a belt through the hole part 22A and binding a rear part of the head of the observer with the belt, the frame 20 can be mounted on the head of the observer 10. An arm 23A is extended upward from an upper part of the front part 21. To a leading end part of the arm 23A, a forehead rest 23B to contact with a forehead of the observer 10 is attached. In addition, a nose pad part 24 is arranged on the front part 21. Also, to a lower end of the front part 21, a rear part of a holding member 25 is attached and to a front part of the holding member 25, a base part 26 is attached. Moreover, to a leading end part of the base part 26, an apparatus of adjusting a distance between a pupil and a lens group 80 which will be described later is attached. A pedestal 71 included in the apparatus of adjusting a distance between a pupil and a lens group 80 is arranged on the base part 26 slidably in a front-rear direction. The optical system 50L included in the image display apparatus for a left eye 30L is housed in a chassis 53L. The optical system 50R included in the image display apparatus for a right eye 30R is housed in a chassis 53R. To the chassis 53L, the image display apparatus for a left eye 30L is attached. To the chassis 53R, the image display apparatus for a left eye 30R is attached. The chassis 53L and the chassis 53R are attached to the pedestal 71. As described in the following, the optical system 50L and the image display apparatus for a left eye 30L, and the optical system 50R and the image display apparatus for a right eye 30R are independently and respectively arranged on the pedestal 71 slidably in a right-left direction. Note that the "front-rear direction" means a direction in which the lens group becomes close to or away from the pupil and the "right-left direction" means a direction in which the image display apparatus for a left eye and the image display apparatus for a right eye become close to or away from each other.

As described above, the optical system 50 includes the reflecting mirror 51, which reflects an image from the image forming apparatus 40, and the lens group 52 into which the image reflected by the reflecting mirror 51 becomes incident. A reflecting mirror 51R and a lens group 52R, which are included in the image display apparatus for a right eye, are attached to the pedestal 71 via the chassis 53R and are slidable on the base part 26 in the right-left direction. Similarly, a reflecting mirror 51L and a lens group 52L, which are included in the image display apparatus for a left eye, are attached to the pedestal 71 via the chassis 53L and are slidable on the base part 26 in the right-left direction. The lens group 52 (52R or 52L) is arranged between the pupil 11 of the observer 10 and the reflecting mirror 51 (51R or 51L). The image forming apparatus 40 is arranged on an upper part of the reflecting mirror 51.

One lens group 52 includes three lenses. The second lens has negative power. A refractive index of a material included in the second lens is higher than a refractive index of a material included in each of the first and the third lenses. The first lens and the third lens include positive power. Also, the second lens is a meniscus lens. More specifically, an effective focal length of the lens group 52 is set as 56.01 mm, a back focal length is set as 44.64 mm, a front focal length is set as −32.16 mm, and an F-number is set as 14.0. A length in the horizontal direction of the lens group 52 is set as 36 mm and a length in the vertical direction thereof is set as 20 mm. Specifications of the first lens (lens closest to pupil), the second lens, and the third lens (lens closest to reflecting mirror) will be indicated in the following table 4 but these specifications are not the limitation. The lens group 52 is a telecentric optical system. More specifically, a side of the reflecting mirror is the telecentric optical system. A distance between the first lens and the pupil (pupil diameter: 4 mm) of the observer 10 is set as 10 mm. Note that when mass of the lens group is set as "1", mass of a lens group in which a distance between the first lens and the pupil of the observer 10 is 12 mm becomes "1.7".

TABLE 4

|  | First lens | Second lens | Third lens |
| --- | --- | --- | --- |
| Refractive index | 1.740 | 2.017 | 1.740 |
| Abbe number | 44.8438 | 20.830 | 44.8438 |
| Effective focal length | 27.392 mm | −43.604 mm | 150.185 mm |
| Back focal length | 28.101 mm | −45.387 mm | 146.790 mm |
| Front focal length | −11.141 mm | 52.856 mm | −124.868 mm |
| F-number | 6.8480 | −10.9010 | 37.5463 |

Figure 15A:
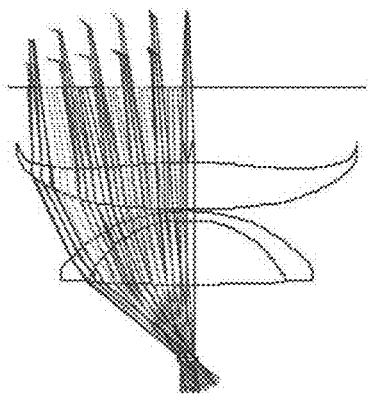
FIG. 15A, FIG. 15B, and FIG. 15C are views illustrating how images from the image forming apparatus are formed by various lens groups.
Figure 15B:
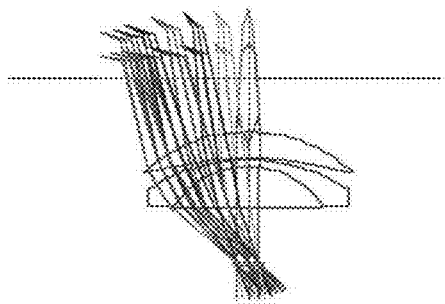
Figure 15C:
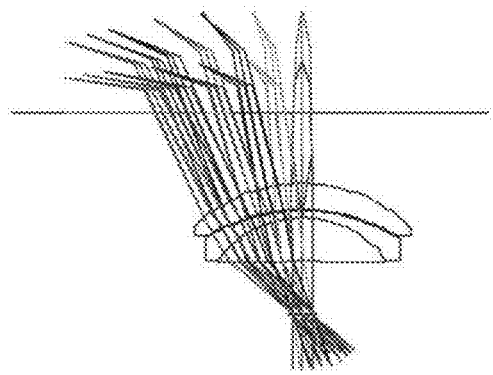

How an image from the image forming apparatus 40 is formed by various lens groups is illustrated in FIG. 15A, FIG. 15B, and FIG. 15C. A lens group illustrated in FIG. 15A is a lens group of a telecentric optical system. In FIG. 15B, a lens group including a configuration close to that of the telecentric optical system is illustrated. In FIG. 15C, a general lens group is illustrated. In the first embodiment, the lens group illustrated in FIG. 15A is used.

In the display apparatus of the first embodiment, an apparatus of adjusting a distance between image display apparatuses 70 to adjust a distance between the image display apparatus for a left eye 30L and the image display apparatus for a right eye 30R is further included. The apparatus of adjusting a distance between image display apparatuses 70 specifically includes the pedestal 71, a feed screw mechanism 73 attached to a side surface 72 placed on an outer side of the pedestal 71, a tap hole 75A to fix the chassis 53 from a lower part slidably on the pedestal 71, guide grooves 74B and 76B provided to the chassis 53, a guide groove 75B provided to the pedestal 71, and pins 74A and 76A which are provided to the pedestal 71 and are to be engaged with the guide grooves 74B and 76B. Note that the guide grooves 75B, 75B, and 76B are extended in the right-left direction. When the feed screw mechanism 73 is rotated, the chassis 53 (chassis 53L or chassis 53R) moves in the right-left direction with respect to the base part 26. The movement of the chassis 53 is performed securely in the right-left direction by engagement of the pin 74A, the tap hole 75A, and the pin 76A with the guide grooves 74B, 75B, and 76B. A distance of the movements of the chassis 53L and 53R in the horizontal direction is set as ±5 mm. In such a manner, since the apparatus of adjusting a distance between image display apparatuses 70 is included, it becomes easy to deal with observers having different distances between pupils. Instead of the feed screw mechanism 73, a combination of a latch mechanism and a knob, that is, a rack and pinion mechanism can also be used. The chassis 53R and 53L are extended further upward compared to what is illustrated in FIG. 14A, FIG. 14B, FIG. 14C, and FIG. 14D. To each of the parts, which are extended upward, of the chassis 53R and 53L, the supporting member 601 or the like which supports the image forming apparatus 40 is attached but is not illustrated.

In the display apparatus of the first embodiment, the apparatus of adjusting a distance between a pupil and a lens group 80 to adjust a distance between the pupil of the observer 10 and the lens group 52 is further included. The apparatus of adjusting a distance between a pupil and a lens group 80 specifically adjusts the distance between the lens group 52 and the pupil of the observer 10. The apparatus of adjusting a distance between a pupil and a lens group 80 specifically includes a side wall 82 attached to a leading end part of a second holding member 26, a feed screw mechanism 83 attached to the side wall 82, a key 27A which is provided to the pedestal 71 and is extended downward from the pedestal 71, a guide groove 27B which is provided to the base part 26 and is engaged with the key 27A, and a fastening member 27C to hold the pedestal 71 slidably with respect to the base part 26. When the feed screw mechanism 83 is rotated, the pedestal 71 moves in the front-rear direction with respect to the base part 26. The movement of the pedestal 71 is performed securely in the front-rear direction by engagement of the key 27A with the guide groove 27B. A distance of movement of the pedestal 71 in the front-rear direction is set as ±4 mm. In such a manner, since the apparatus of adjusting a distance between a pupil and a lens group 80 is included, it becomes easy to deal with observers having different distances between the pupil and the lens group. Thus, it is possible to provide a display apparatus capable of adjusting and accommodating a distance between a pupil of an observer and a lens group adequately and easily. Instead of the feed screw mechanism 83, a combination of a latch mechanism and a knob, that is, a rack and pinion mechanism can also be used.

In a display apparatus of the present disclosure, the image forming apparatus is curved. Thus, for example, it is possible to reduce a difference between an optical path length of light emitted from a center part of the image forming apparatus and an optical path length of light emitted from an edge part of a display region of the image forming apparatus. As a result, for example, it is possible to control an increase in a size of a lens group included in an optical system and to realize a large view angle with a compact size and light weight. In addition, a normal of a reflecting mirror included in an optical system of an image display apparatus for a left eye and a normal of a reflecting mirror included in an optical system of an image display apparatus for a right eye intersect with each other in a space on an opposite side of an observer with respect to the reflecting mirrors. Thus, it is possible to arrange two image forming apparatuses side by side easily with high flexibility in designing.

Second Embodiment

Figure 11A:
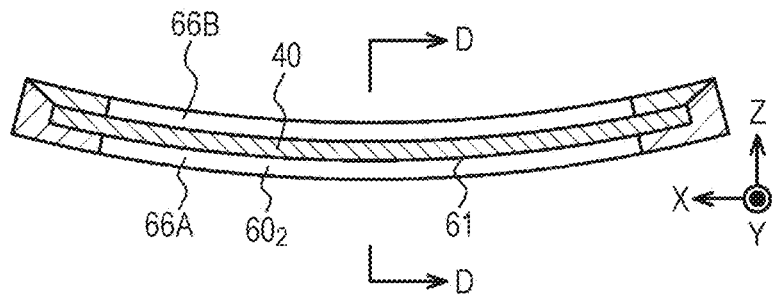
FIG. 11A is a schematic sectional view of a supporting member and an image forming apparatus included in a display apparatus of a second embodiment.
Figure 11B:
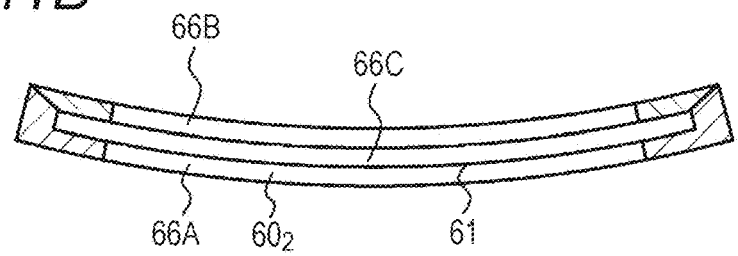
FIG. 11B is a schematic sectional view of the supporting member.
Figure 11C:
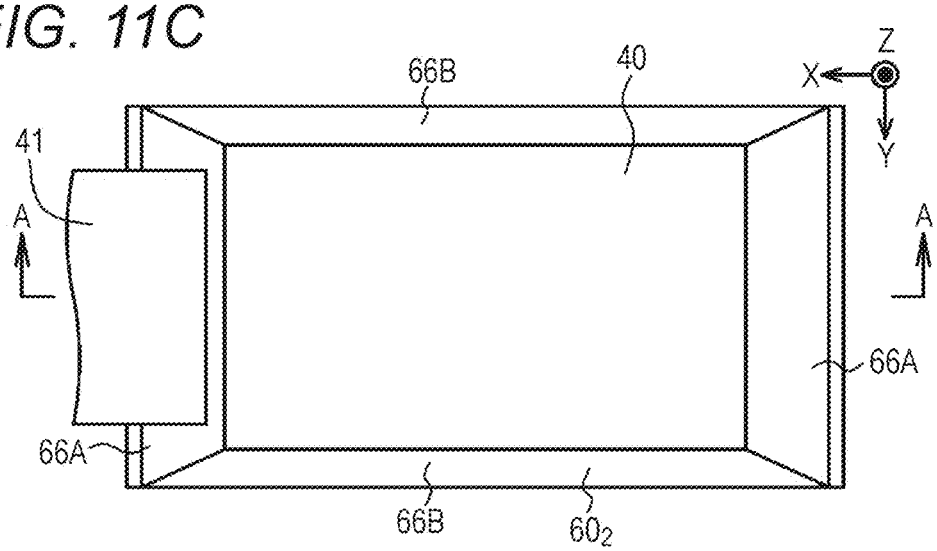
FIG. 11C is a schematic plane view of the supporting member and the image forming apparatus.
Figure 11D:
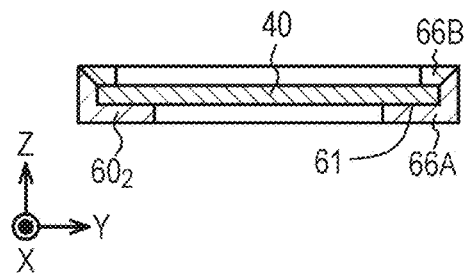
FIG. 11D is a schematic sectional view, along an arrow D-D in FIG. 11A, of the supporting member and the image forming apparatus.

The second embodiment is a modification of the first embodiment. A schematic sectional view of a supporting member and an image forming apparatus included in an image display apparatus of the second embodiment is illustrated in FIG. 11A. A schematic sectional view of the supporting member is illustrated in FIG. 11B. A schematic plane view of the supporting member and the image forming apparatus is illustrated in FIG. 11C. A schematic sectional view of the supporting member and the image forming apparatus which view is along an arrow D-D in FIG. 11A is illustrated in FIG. 11D.

In the image display apparatus of the second embodiment, an outer peripheral part of an image forming apparatus 40 which part is extended in an X-direction is sandwiched by a supporting member 602. The supporting member 602 includes a lower-side member 66A and an upper-side member 66B. By a combination of the lower-side member 66A and the upper-side member 66B, a kind of frame member is configured. On an inner side surface of the supporting member 602, a groove part 66C is formed. Then, into the groove part 66C, the outer peripheral part of the image forming apparatus 40 which part is extended in the X-direction is fit. The lower-side member 66A and the upper-side member 66B may be fixed to each other by a screw (not illustrated) or may be fixed to each other by using an adhesive. The outer peripheral part of the image forming apparatus 40 which part is extended in the X-direction is preferably fixed to the groove part 66C by an adhesive. Note that in the illustrated example, not only the outer peripheral part of the image forming apparatus 40 which part is extended in the X-direction but also an outer peripheral part of the image forming apparatus 40 which part is extended in a Y-direction is sandwiched by the supporting member 602. However, only the outer peripheral part of the image forming apparatus 40 which part is extended in the X-direction may be sandwiched by the supporting member 602. In this case, the outer peripheral part of the image forming apparatus 40 which part is extended in the Y-direction is preferably fixed to the supporting member 602 by using an adhesive.

Other than the above points, a configuration and structure of the display apparatus or the image display apparatus of the second embodiment are similar to the configuration and structure of the display apparatus or the image display apparatus described in the first embodiment, and thus, detail description thereof is omitted.

Third Embodiment

Figure 12A:
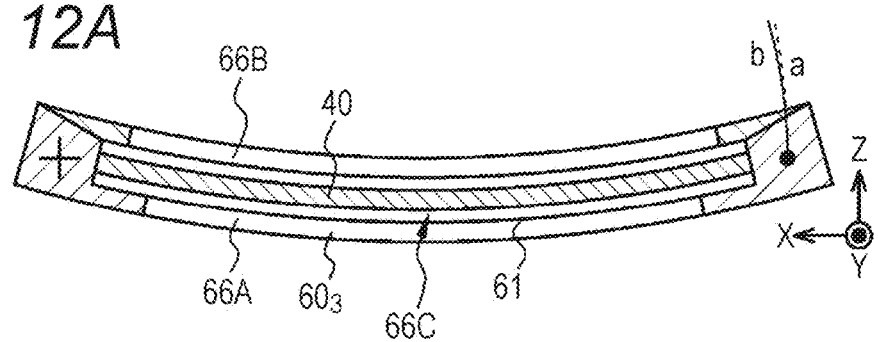
FIG. 12A is a schematic sectional view of a supporting member and an image forming apparatus included in a display apparatus of a third embodiment.
Figure 12B:
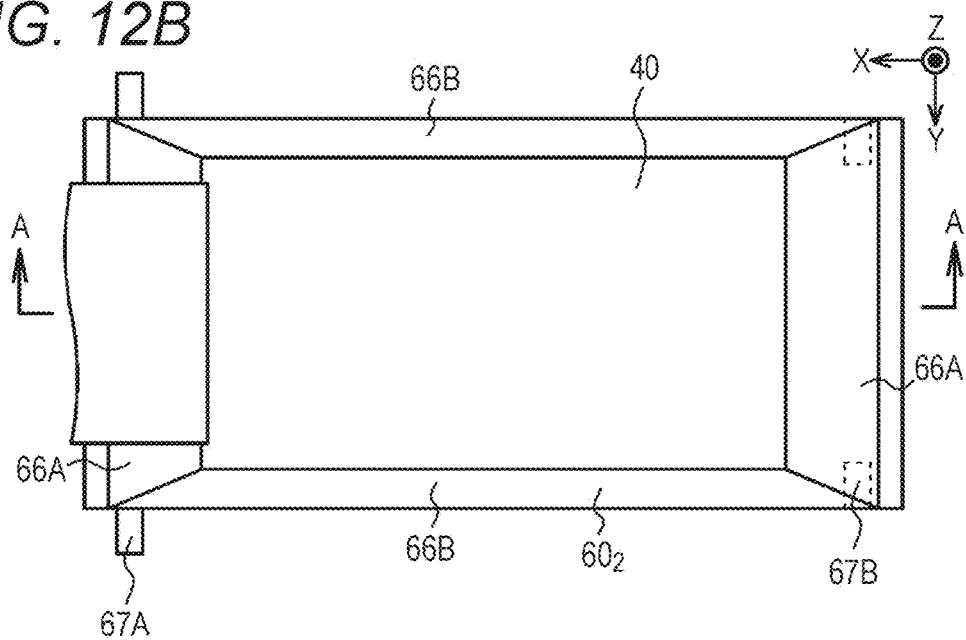
FIG. 12B is a schematic plane view of the supporting member and the image forming apparatus.

The third embodiment is a modification of the second embodiment. An image forming apparatus 40 is curved also in the third embodiment. However, unlike the second embodiment, a degree of curvature can be varied. A schematic sectional view of a supporting member and an image forming apparatus which are included in an image display apparatus of the third embodiment is illustrated in FIG. 12A. A schematic plane view of the supporting member and the image forming apparatus is illustrated in FIG. 12B.

In the third embodiment, there is a gap between a groove part 66C and an outer peripheral part of the image forming apparatus 40 which part is extended in an X-direction. Then, on a side surface extended in the X-direction of a supporting member 603, a projection part 67A and a screw part 67B are provided. The supporting member 603 is stored in a housing (not illustrated) an upper part of which is open. The housing is attached to an upper part of each of chassis 53R and 53L. On a side surface of the housing, a hole part into which the projection part 67A is fit is formed. Also, to a part of the side surface of the housing which part faces the screw part 67B, a guide groove substantially extended upward and downward is formed. A screw is inserted into the guide groove and is screwed into the screw part 67B, whereby, it is possible to fix the supporting member 603 on the side surface of the housing. Here, depending on a position, where the screw is fixed, in the guide groove, force in the X-direction applied to the supporting member 603 and the image forming apparatus 40 varies. In FIG. 12A, a center of the projection part 67A is indicated by a cross. Also, a track of a circle of the screw part 67B with the center of the projection part 67A as a center is indicated by a dotted line "a" and a track of a center of a through hole is indicated by a solid line "b". In a case where the screw part 67B is moved to an upper part in FIG. 12A with the center of the projection part 67A as the center, a distance between the center of the projection part 67A and a center of the screw part 67B becomes short. Accordingly, compression force is applied in the X-direction of the supporting member 603 and the image forming apparatus 40. As a result, a degree of curvature of the image forming apparatus 40 varies. Since there is a gap between the groove part 66C and the outer peripheral part of the image forming apparatus 40 which part is extended in the X-direction, it becomes possible to permit the variation in the degree of curvature of the image forming apparatus 40. After the degree of curvature of the image forming apparatus 40 is determined, a gap is filled by an adequate material (such as shim). Alternatively, an elastic material is sandwiched in the gap in advance.

Figure 12C:
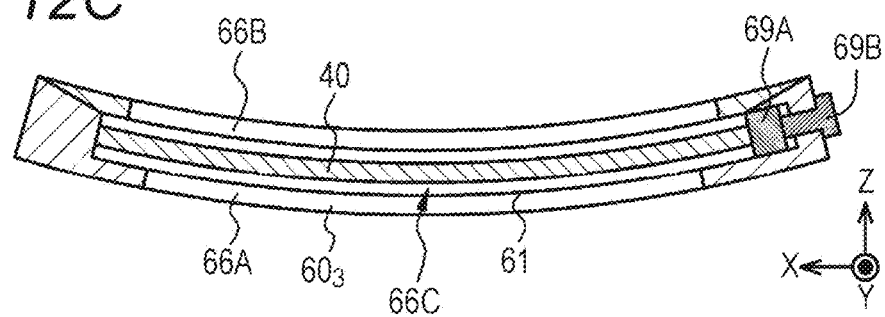
FIG. 12C is a schematic sectional view of a supporting member and an image forming apparatus included in a modification of the display apparatus of the third embodiment.

Note that as illustrated in a schematic sectional view, in FIG. 12C, of a supporting member and an image forming apparatus which are included in a modification of the image display apparatus of the third embodiment, force applied in an X-direction of a supporting member 603 and an image forming apparatus 40 may be varied by a pushing member 68A and a set-screw 68B to move the pushing member 68A in the X-direction.

Fourth Embodiment

The fourth embodiment is a modification of the first to third embodiments and relates to a display apparatus of a second configuration of the present disclosure. In a display apparatus of the fourth embodiment, each image display apparatus 30 further includes an apparatus of adjusting a distance between an image forming apparatus and a reflecting mirror 90 to adjust a distance between an image forming apparatus 40 and a reflecting mirror 51.

Figure 17A:
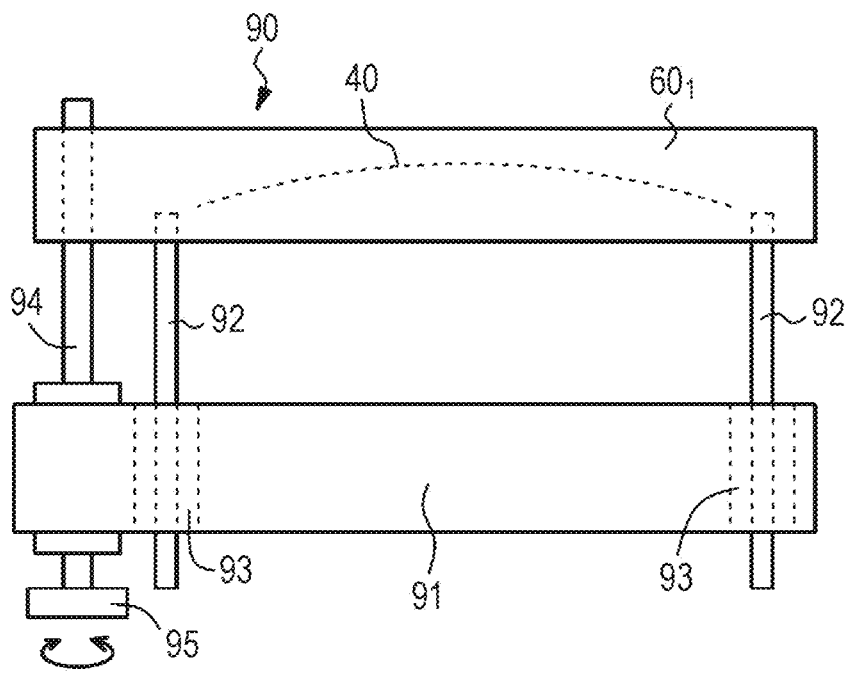
FIG. 17A and FIG. 17B are schematic views of the apparatus of adjusting a distance between an image forming apparatus and a reflecting mirror.

As described above, to a part, which is extended upward, of each of chassis 53R and 53L, a supporting member 601 or the like which supports the image forming apparatus 40 is attached. As illustrated in FIG. 17A, the apparatus of adjusting a distance between an image forming apparatus and a reflecting mirror 90 includes, for example, a base member of an adjustment apparatus 91, a shaft 92 attached to the supporting member 601, a feed screw mechanism 95 attached to the base member of an adjustment apparatus 91, and a shaft 94 which is extended from the feed screw mechanism 95 and is attached to the supporting member 601. The supporting member 601 can freely slide the shaft 92 via a bush 93 and can freely change a distance with the base member of an adjustment apparatus 91. Then, to the part, which is extended upward, of each of the chassis 53R and 53L, the base member of an adjustment apparatus 91 is attached. By rotating the feed screw mechanism 95, the shaft 94 is moved in an up-down direction in the drawing. As a result, a distance between the base member of an adjustment apparatus 91 and the supporting member 601 can be changed. However, movement of the supporting member 601 in the up-down direction in the drawing is regulated by the shaft 92 via the bush 93.

Figure 17B:
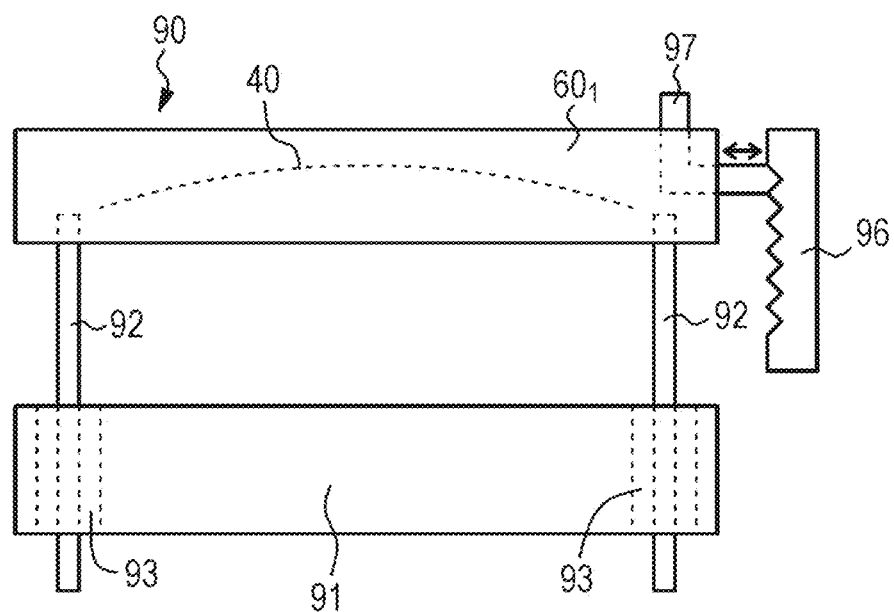

Alternatively, as illustrated in FIG. 17B, the apparatus of adjusting a distance between an image forming apparatus and a reflecting mirror 90 includes, for example, a latch mechanism 96 and a pin 97 which is fit into the latch mechanism. Then, by moving the pin 97 in a left direction in the drawing (see arrow in FIG. 17B), the pin 97 is released from the latch mechanism 96. Then, by moving the pin 97 in a right direction in the drawing after the supporting member 601 is moved in the up-down direction in the drawing, the pin 97 is fit into the latch mechanism 96.

In such a manner, by using the apparatus of adjusting a distance between an image forming apparatus and a reflecting mirror 90 illustrated in FIG. 17A or FIG. 17B, a distance between the image forming apparatus 40 and the reflecting mirror 51 can be adjusted and accommodated according to eyesight of an observer. However, the apparatus of adjusting a distance between an image forming apparatus and a reflecting mirror 90 illustrated in FIG. 17A or FIG. 17B is an example and any type of apparatus can be used as long as the apparatus can adjust a distance between the image forming apparatus and the optical system. For example, instead of the bush 93, a linear guide rail can be used or a constrained mechanism between two planes arranged at a right angle can be used. Also, instead of the feed screw mechanism 95 or the latch mechanism 96, a rack and pinion mechanism may be employed.

With respect to the distance between the image forming apparatus 40 and the reflecting mirror 51, a distance detection apparatus to detect the distance between the image forming apparatus 40 and the reflecting mirror 51 is arranged in the apparatus of adjusting a distance between an image forming apparatus and a reflecting mirror 90. The distance detection apparatus only needs to be an adequate apparatus depending on a configuration and structure of the apparatus of adjusting a distance between an image forming apparatus and a reflecting mirror 90. More specifically, for example, an apparatus to detect a position (angle) of the feed screw mechanism 95 or an apparatus to detect a position of the pin 97 in the latch mechanism 96 may be used.

Then, in the display apparatus of the fourth embodiment, a display control apparatus (not illustrated) to control a size of a whole image from the image forming apparatus 40 according to a distance between the image forming apparatus 40 and the reflecting mirror 51 is further included. That is, as the distance between the image forming apparatus 40 and the reflecting mirror 51 becomes shorter, the size of the whole image from the image forming apparatus 40 is reduced. Note that the control of the size of the whole image may be a well-known control method such as performing enlargement/reduction of the size of the whole image by performing various kinds of signal processing on an image signal used for forming an image in the image forming apparatus 40. The distance between the image forming apparatus and the reflecting mirror 51 may be detected by the above-described distance detection apparatus.

Figure 16:
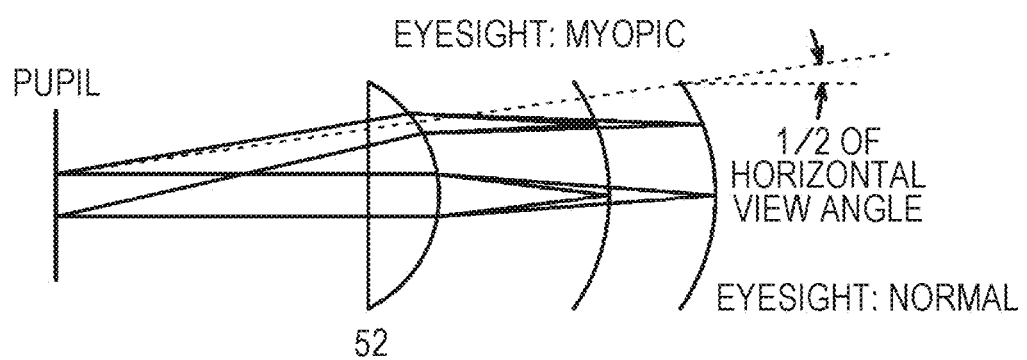
FIG. 16 is a view conceptually illustrating a state to adjust a distance between the image forming apparatus and the optical system by an apparatus of adjusting a distance between an image forming apparatus and a reflecting mirror.

A relationship between a quantity of movement of the image forming apparatus 40 with respect to the reflecting mirror 51 and the size of the whole image, that is, a state in which the distance between the image forming apparatus and the optical system is adjusted by the apparatus of adjusting a distance between an image forming apparatus and a reflecting mirror is illustrated conceptually in FIG. 16. When an observer has a myopic vision compared to a case where eyesight of an observer is normal (diopter value: 0), a distance between the image forming apparatus and the optical system is reduced. Here, as illustrated in FIG. 16, the size of the whole image from the image forming apparatus 40 is reduced. A relationship among a diopter value, a quantity of movement of the image forming apparatus, and a size of the whole image (image output size) is indicated in the following table 5.

TABLE 5

| Diopter value | Quantity of movement | Image output size |
| --- | --- | --- |
| −3 | −9.4 mm | 95.5 mm |
| −2 | −6.3 mm | 97.8 mm |
| −1 | −3.1 mm | 100.3 mm |
| 0 | 0 | 103.4 mm |
| 1 | +3.1 mm | 106.7 mm |
| 2 | +6.3 mm | 110.0 mm |
| 3 | +9.4 mm | 113.8 mm |

When the image forming apparatus 40 (more specifically, supporting member 601) is attached to the part, which is extended upward, of each of the chassis 53R and 53L, there may be a case where a fine adjustment in the attachment of the supporting member 601 is necessary. Note that such a fine adjustment is usually necessary during assembling of the display apparatus. Then, in such a case, when it is assumed that an axis which passes through a predetermined point (collision point of an image forming apparatus and an optical axis) of the image forming apparatus 40 and is parallel in the X-direction is an X-axis and an axis which passes through a predetermined point (collision point of an image forming apparatus and an optical axis) of the image forming apparatus 40 and is parallel in the Y-direction is a Y-axis (see FIG. 6A), the image display apparatus 30 includes a rotation apparatus to rotate the image forming apparatus 40 with at least one of the X-axis, the Y-axis, and a Z-axis as a center. An example of the rotation apparatus includes a combination of a set-screw and a drawing thread which are attached to each of the chassis 53R and 53L. By a fine adjustment of the set-screw and the drawing thread, it is possible to perform a fine adjustment in the attachment of the supporting member 601 to the part, which is extended upward, of each of the chassis 53R and 53L. Also, when a guide groove is provided to the part, which is extended upward, of each of the chassis 53R and 53L and a feed screw mechanism is provided to the supporting member 601, that is, when a moving apparatus including a guide groove and a feed screw mechanism is provided, it is possible to move the image forming apparatus 40 in the X-direction with respect to the reflecting mirror 51. For example, the image forming apparatus 40 is rotated for 40 mm radians with the X-axis as a center, the image forming apparatus 40 is rotated for 40 mm radians with the Y-axis as a center, or the image forming apparatus 40 is rotated for 40 mm radians with the Z-axis as a center.

In the display apparatus of the fourth embodiment, since the apparatus of adjusting a distance between an image forming apparatus and a reflecting mirror is included, a display apparatus capable of dealing with a difference in eyesight of observers, which difference is caused depending on the observers, adequately and easily with a simple configuration and structure can be provided.

In the above, the present disclosure has been described based on the preferred embodiments. However, the present disclosure is not limited to these embodiments. The configuration and structure of the image display apparatus and the image forming apparatus which have been described in each of the embodiments are examples and can be modified arbitrarily. It is also possible to configure a projector by a combination of the image forming apparatus and the supporting member, which supports the image forming apparatus, which have been described in each of the embodiments. Also, instead of the reflecting mirror, a semi-transmissive mirror (also referred to as partial-reflecting mirror, partial-transmissive mirror, semi-transmissive mirror, and half mirror) can be used.

Also, the present technique may include the following configurations.

[A01] <Display Apparatus>

A display apparatus including: (1) a frame; and (2) an image display apparatus for a left eye and an image display apparatus for a right eye which are attached to the frame, wherein each image display apparatus includes (A) an image forming apparatus, and (B) an optical system configured to guide an image from the image forming apparatus to a pupil of an observer, the optical system includes a reflecting mirror configured to reflect the image from the image forming apparatus and a lens group which is arranged between the pupil of the observer and the reflecting mirror and into which the image reflected by the reflecting mirror becomes incident, when it is assumed that a direction of the image forming apparatus which direction corresponds to a first direction of the image is an X-direction, a direction of the image forming apparatus which direction corresponds to a second direction, which is different from the first direction, of the image is a Y-direction, the image forming apparatus is curved in the X-direction or the Y-direction, or in the X-direction and the Y-direction, and a normal of the reflecting mirror included in the optical system of the image display apparatus for a left eye and a normal of the reflecting mirror included in the optical system of the image display apparatus for a right eye intersect with each other in a space on an opposite side of the observer with respect to the reflecting mirror.

[A02] The display apparatus according to [A01], wherein the normal of the reflecting mirror included in the optical system of the image display apparatus for a left eye and the normal of the reflecting mirror included in the optical system of the image display apparatus for a right eye intersect with each other in a space lower than a virtual plane including both pupils of the observer and an infinite distance.

[A03] The display apparatus according to [A02], wherein when it is assumed that the virtual plane including both of the pupils of the observer and the infinite distance is an xy plane, a straight line which connects both of the pupils of the observer is an x-axis, an optical axis of a right eye of the observer is an y-axis, a point on the reflecting mirror at which point an optical axis of the lens group included in the optical system of the image display apparatus for a right eye collides with the reflecting mirror is a collision point of a reflecting mirror for a right eye and an optical axis, and the reflecting mirror included in the optical system of the image display apparatus for a right eye is arranged in parallel with an xz plane, and when it is further assumed that an axis on the reflecting mirror which axis passes through the collision point of a reflecting mirror for a right eye and an optical axis and is in parallel with the xy plane is a ζ-axis and an axis on the reflecting mirror which axis passes through the collision point of a reflecting mirror for a right eye and an optical axis and is orthogonal to the ζ-axis is an η-axis, a plane mirror included in the optical system of the image display apparatus for a right eye is rotated for an angle θ1=45°±5° with the ζ-axis as a center and with an upper part of the plane mirror being rotated in a direction away from the observer and is also rotated for an angle θ2=7° to 21° with the η-axis as a center and with a right end of the plane mirror being rotated in the direction away from the observer, and the image forming apparatus and the optical system of the image display apparatus for a left eye and the image forming apparatus and the optical system of the image display apparatus for a right eye are arranged in a mirror-symmetrical manner with respect to a virtual plane which passes through a midpoint of a line segment to connect both of pupils of the observer and is in parallel with a yz plane.

[A04] The display apparatus according to [A03], wherein the image forming apparatus is arranged in an upper part of the reflecting mirror.

[B01] The display apparatus according to any one of [A01] to [A04], wherein each image display apparatus further includes a supporting member configured to support the image forming apparatus, a supporting surface of the supporting member configured to support the image forming apparatus is curved in the X-direction or the Y-direction, or in the X-direction and the Y-direction, whereby the image forming apparatus is curved.

[B02] The display apparatus according to [B01], wherein a degree of curvature in the X-direction of the supporting surface of the supporting member is larger than a degree of curvature in the Y-direction thereof.

[B03] The display apparatus according to [B01] or [B02], wherein the supporting member includes a pressing member, an outer shape of the image forming apparatus is a rectangular shape, and an outer peripheral part of the image forming apparatus which part is extended in the X-direction is fixed to the supporting member by the pressing member.

[B04] The display apparatus according to [B01] or [B02], wherein an outer shape of the image forming apparatus is a rectangular shape, and an outer peripheral part of the image forming apparatus which part is extended in the X-direction is sandwiched by the supporting member.

[B05] The display apparatus according to any one of [A01] to [B04], wherein each image display apparatus includes an apparatus of adjusting a distance between an image forming apparatus and a reflecting mirror which apparatus is configured to adjust a distance between the image forming apparatus and the reflecting mirror.

[B06] The display apparatus according to [B05], further including a display control apparatus configured to control a size of a whole image from the image forming apparatus according to the distance between the image forming apparatus and the reflecting mirror.

[B07] The display apparatus according to any one of [A01] to [B06], wherein each image display apparatus includes an apparatus of adjusting a distance between a pupil and a lens group which apparatus is configured to adjust a distance between the lens group and the pupil of the observer.

[B08] The display apparatus according to any one of [A01] to [B07], wherein when an axis which passes through a predetermined point of the image forming apparatus and which is parallel in the X-direction is an X-axis and an axis which passes through a predetermined point of the image forming apparatus and which is parallel in the Y-direction is a Y-axis, the image display apparatus further includes a rotation apparatus configured to rotate the image forming apparatus with at least one of the X-axis, the Y-axis, and a Z-axis as a center.

[B09] The display apparatus according to any one of [A01] to [B08], further including a moving apparatus configured to move the image forming apparatus in the X-direction with respect to the reflecting mirror.

[B10] The display apparatus according to any one of [A01] to [B09], further including an apparatus of adjusting a distance between image display apparatuses which apparatus configured to adjust a distance between the image display apparatus for a left eye and the image display apparatus for a right eye.

[C01] The display apparatus according to any one of [A01] to [B10], wherein an outer shape of the image forming apparatus is a rectangular shape, and a wiring line is extended to an external part from an outer peripheral part of the image forming apparatus which part is extended in the Y-direction.

[C02] The display apparatus according to any one of [A01] to [C01], wherein one lens group includes three lenses, a second lens has negative power, and a refractive index of a material included in the second lens is higher than a refractive index of a material of each of a first lens and a third lens.

[C03] The display apparatus according to [C02], wherein the first lens and the third lens have positive power.

[C04] The display apparatus according to [C02] or [C03], wherein a reflecting mirror side of the lens group is a telecentric optical system.

[C05] The display apparatus according to any one of [A01] to [C04] wherein the image forming apparatus includes an organic electroluminescence display apparatus.

[C06] The display apparatus according to any one of [A01] to [C05], wherein a frame is mounted on a head of the observer.

REFERENCE SIGNS LIST

10 Observer
11, 11L, 11R Pupil of observer
20 Frame
21 Front part
22 Side part
22A Hole part
23A Arm part
23B Forehead rest
24 Nose pad part
25 Holding member
26 Base part
27A Key
27B Guide groove
27C Fastening member
30, 30R, 30L Image display apparatus
40 Image forming apparatus
41 Wiring line
50 Optical system
51, 51R, 51L Reflecting mirror
52, 52R, 52L Lens group
53R, 53L Chassis
601, 602, 603 Supporting member
61 Supporting surface
62A, 62B Outer peripheral part of supporting member
62C Contact surface of outer peripheral part
62D Screw part
63 Fixing member
64 Screw
65 Pressing member
65A One end part of pressing member
65B Other end part of pressing member
66A Lower-side member
66B Upper-side member
66C Groove part
67A Projection part
67B Screw part
68A Pushing member
68B Set-screw
70 Apparatus of adjusting distance between image display apparatuses
71 Pedestal
72 Side surface placed outside of pedestal
73 Feed screw mechanism
74A, 76A Pin
75A Tap hole
74B, 75B, 76B Guide groove
80 Apparatus of adjusting distance between pupil and lens group
82 Side wall
83 Feed screw mechanism
90 Apparatus of adjusting distance between image forming apparatus and reflecting mirror
91 Base member of adjustment apparatus
92, 94 Shaft
93 Bush
95 Feed screw mechanism
96 Latch mechanism
97 Pin fit into latch mechanism

The invention claimed is:

1. A display apparatus comprising:
a frame; and
an image display apparatus for a left eye and an image display apparatus for a right eye which are attached to the frame,
wherein each image display apparatus includes
a curved image forming apparatus configured to generate an image and mounted to the frame out of a line of sight of an observer, and
an optical system configured to guide the image from the curved image forming apparatus to a pupil of the observer,
the optical system including a planar reflecting mirror configured to reflect the image from the curved image forming apparatus and a lens group which is arranged between the pupil of the observer and the reflecting mirror,
when a direction of the image forming apparatus which direction corresponds to a first direction of the image is an X-direction, a direction of the image forming apparatus which direction corresponds to a second direction, which is different from the first direction, of the image is a Y-direction, the image forming apparatus is curved in the X-direction or the Y-direction, or in the X-direction and the Y-direction, and
a normal of the reflecting mirror included in the optical system of the image display apparatus for a left eye and a normal of the reflecting mirror included in the optical system of the image display apparatus for a right eye intersect with each other in a space on an opposite side of the observer with respect to the reflecting mirror.

2. The display apparatus according to claim 1, wherein the normal of the reflecting mirror included in the optical system of the image display apparatus for a left eye and the normal of the reflecting mirror included in the optical system of the image display apparatus for a right eye intersect with each other in a space lower than a virtual plane including both pupils of the observer and an infinite distance.

3. The display apparatus according to claim 2, wherein when it is assumed that the virtual plane including both of the pupils of the observer and the infinite distance is an xy plane, a straight line which connects both of the pupils of the observer is an x-axis, an optical axis of a right eye of the observer is an y-axis, a point on the reflecting mirror at which point an optical axis of the lens group included in the optical system of the image display apparatus for a right eye collides with the reflecting mirror is a collision point of a reflecting mirror for a right eye and an optical axis, and the reflecting mirror included in the optical system of the image display apparatus for a right eye is arranged in parallel with an xz plane, and when it is further assumed that an axis on the reflecting mirror which axis passes through the collision point of a reflecting mirror for a right eye and an optical axis and is in parallel with the xy plane is a ζ-axis and an axis on the reflecting mirror which axis passes through the collision point of a reflecting mirror for a right eye and an optical axis and is orthogonal to the ζ-axis is an η-axis, a plane mirror included in the optical system of the image display apparatus for a right eye is rotated for an angle θ1=45°±5° with the ζ-axis as a center and with an upper part of the plane mirror being rotated in a direction away from the observer and is also rotated for an angle θ2=7° to 21° with the η-axis as a center and with a right end of the plane mirror being rotated in the direction away from the observer, and the image forming apparatus and the optical system of the image display apparatus for a left eye and the image forming apparatus and the optical system of the image display apparatus for a right eye are arranged in a mirror-symmetrical manner with respect to a virtual plane which passes through a midpoint of a line segment to connect both of the pupils of the observer and is in parallel with a yz plane.

4. The display apparatus according to claim 3, wherein the image forming apparatus is arranged in an upper part of the reflecting mirror.

5. The display apparatus according to claim 1, wherein each image display apparatus further includes a supporting member configured to support the image forming apparatus, a supporting surface of the supporting member configured to support the image forming apparatus is curved in the X-direction or the Y-direction, or in the X-direction and the Y-direction, whereby the image forming apparatus is curved.

6. The display apparatus according to claim 5, wherein a degree of curvature in the X-direction of the supporting surface of the supporting member is larger than a degree of curvature in the Y-direction thereof.

7. The display apparatus according to claim 5, wherein the supporting member includes a pressing member, an outer shape of the image forming apparatus is a rectangular shape, and an outer peripheral part of the image forming apparatus which part is extended in the X-direction is fixed to the supporting member by the pressing member.

8. The display apparatus according to claim 5, wherein an outer shape of the image forming apparatus is a rectangular shape, and an outer peripheral part of the image forming apparatus which part is extended in the X-direction is sandwiched by the supporting member.

9. The display apparatus according to claim 1, wherein each image display apparatus includes an apparatus of adjusting a distance between an image forming apparatus and a reflecting mirror which apparatus is configured to adjust a distance between the image forming apparatus and the reflecting mirror.

10. The display apparatus according to claim 9, further comprising a display control apparatus configured to control a size of a whole image from the image forming apparatus according to the distance between the image forming apparatus and the reflecting mirror.

11. The display apparatus according to claim 1, wherein each image display apparatus includes an apparatus of adjusting a distance between a pupil and a lens group which apparatus is configured to adjust a distance between the lens group and the pupil of the observer.

12. The display apparatus according to claim 1, wherein when an axis which passes through a predetermined point of the image forming apparatus and which is parallel in the X-direction is an X-axis and an axis which passes through a predetermined point of the image forming apparatus and which is parallel in the Y-direction is a Y-axis, the image display apparatus further includes a rotation apparatus configured to rotate the image forming apparatus with at least one of the X-axis, the Y-axis, and a Z-axis as a center.

13. The display apparatus according to claim 1, further comprising a moving apparatus configured to move the image forming apparatus in the X-direction with respect to the reflecting mirror.

14. The display apparatus according to claim 1, further comprising an apparatus of adjusting a distance between image display apparatuses which apparatus configured to adjust a distance between the image display apparatus for a left eye and the image display apparatus for a right eye.

15. The display apparatus according to claim 1, wherein an outer shape of the image forming apparatus is a rectangular shape, and a wiring line is extended to an external part from an outer peripheral part of the image forming apparatus which part is extended in the Y-direction.

16. The display apparatus according to claim 1, wherein one lens group includes three lenses, a second lens has negative power, and a refractive index of a material included in the second lens is higher than a refractive index of a material of each of a first lens and a third lens.

17. The display apparatus according to claim 16, wherein the first lens and the third lens have positive power.

18. The display apparatus according to claim 16, wherein a reflecting mirror side of the lens group is a telecentric optical system.

19. The display apparatus according to claim 1, wherein the image forming apparatus includes an organic electroluminescence display apparatus.

20. The display apparatus according to claim 1, wherein a frame is mounted on a head of the observer.

* * * * *